United States Patent
Nishimura et al.

[11] Patent Number: 5,309,275
[45] Date of Patent: May 3, 1994

[54] SEMICONDUCTOR OPTICAL AMPLIFYING APPARATUS

[75] Inventors: Michiyo Nishimura, Fujisawa; Jun Nitta, Sagamihara; Kenji Nakamura, Hadano; Masao Majima, Atsugi; Toru Nakata, Ebina, all of Japan

[73] Assignee: Canon Kabushiki Kaisha, Tokyo, Japan

[21] Appl. No.: 716,944

[22] Filed: Jun. 18, 1991

[30] Foreign Application Priority Data

Jun. 21, 1990 [JP] Japan ................ 2-163665

[51] Int. Cl.$^5$ .......... H01S 3/19; H04B 10/12; G02B 6/12; H01L 33/00
[52] U.S. Cl. .................. 359/344; 359/122; 359/337; 359/485; 385/11; 372/45
[58] Field of Search ........... 359/122, 156, 337, 343, 359/344, 485; 372/45, 46; 357/17; 385/11; 250/227.17

[56] References Cited

U.S. PATENT DOCUMENTS

| 4,815,802 | 3/1989 | Nakamura | 350/96.13 |
| 4,886,334 | 12/1989 | Aoki | 350/96.15 |
| 5,026,148 | 6/1991 | Wen et al. | 359/485 |
| 5,120,664 | 6/1992 | Murotani | 437/2 |
| 5,157,544 | 2/1991 | Nitta | 359/344 |

FOREIGN PATENT DOCUMENTS

| 362789 | 10/1989 | European Pat. Off. |
| 62-039935 | 2/1987 | Japan |
| 62-089383 | 4/1987 | Japan |
| 64-61079 | 3/1989 | Japan |
| 1102983 | 4/1989 | Japan |
| 1-257386 | 10/1989 | Japan |
| 2-127624 | 5/1990 | Japan |

OTHER PUBLICATIONS

Cha et al, Electron. Lett., vol. 25, #18, pp. 1241–1242, Aug. 1989.

Devlin et al, Second Int. Conf. Indium Phosphide and Related Materials, Apr. 25, 1990, pp. 367–371; Abst. only provided herewith.

Skinner et al, IEEE J. Q. E., vol. 25, #1, Jan. 1989, pp. 6–11; abst. only provided herewith.

Bonsett et al, Appl. Phys. Lett., vol. 51, #7, pp. 499–501, Aug. 17, 1987; Abst. only provided herewith.

"Cascaded Inline Semiconductor Laser Amplifiers in a Coherent Optical Fibre Transmission System," by G. Grosskopf et al., Electronics Letters, vol. 24, No. 9, pp. 551–552 (Apr. 28, 1988).

*Primary Examiner*—Nelson Moskowitz
*Attorney, Agent, or Firm*—Fitzpatrick, Cella, Harper & Scinto

[57] ABSTRACT

A semiconductor optical amplifying apparatus includes: a substrate; an active layer having a quantum well structure formed on the substrate, the active layer guiding first waveguide mode light and second waveguide mode light having a polarization direction perpendicular to that of the first waveguide mode light and amplifying the first waveguide mode light and the second waveguide mode light, the active layer having quantum wells such that projected quantization axes obtained by projecting quantization axes of the quantum wells thereof on a plane perpendicular to a light waveguide direction are inclined at 45° with respect to vibration directions of electric field vectors of the first waveguide mode light and the second waveguide mode light; and an electrode for supplying a current to the active layer.

30 Claims, 14 Drawing Sheets

FIG. 2A
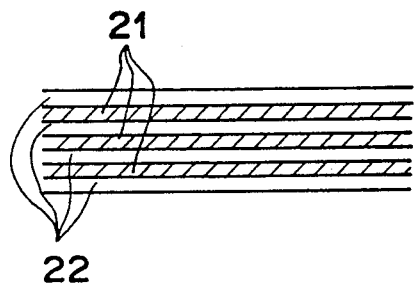
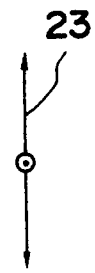
FIG. 2B
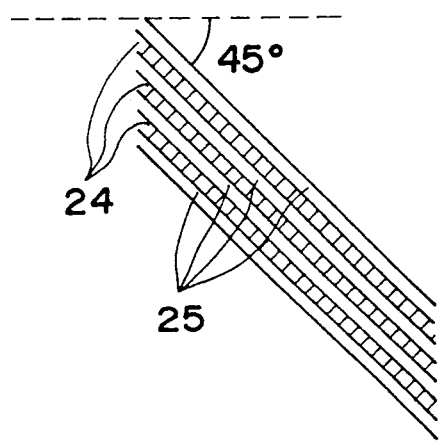
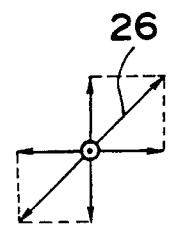
FIG. 2C
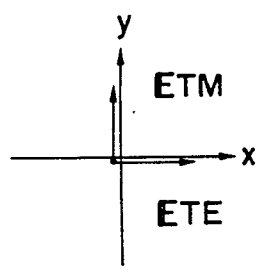

SEMICONDUCTOR OPTICAL AMPLIFYING APPARATUS

BACKGROUND OF THE INVENTION

1. Field of the Invention

The present invention relates to an optical amplifying apparatus having a semiconductor laser structure.

2. Related Background Art

A semiconductor optical amplifying apparatus generally comprises a semiconductor laser structure including an active layer and a cladding layer and performs optical amplification of external input light upon reception of a bias current having a threshold value or less. In the field of optical communications, semiconductor optical amplifying apparatuses have been developed as devices for compensating for optical losses occurring in an optical fiber or a connection between optical fibers.

One of the problems posed by use of such a semiconductor optical amplifier in an optical fiber communication system is polarization dependency of an optical amplification factor (i.e., the nature exhibiting different amplification factors for different polarization modes). In general, output light transmitted through an optical fiber does not have a stable polarization state as a function of time. When light having polarization dependency is incident on the optical amplifier described above, the level of output light from the optical amplifier cannot be kept constant but varies as a function of time. A lot of loads such as a requirement of a wide dynamic range are imposed on a receiver system, and the size of a communication system or network is limited, resulting in a decisive drawback.

To the contrary, when a constant polarization plane fiber is used in optical transmission, the above problem can be solved, but a total cost is undesirably increased. In addition, a system using the above fiber does not properly match other systems, thus posing another concomitant problem.

Many attempts have been conventionally made such that an optical amplifier not depending on polarization (i.e., the nature having almost the same amplification factor for different polarization modes) is arranged, or a cause for polarization dependency of the amplification factor is clarified to optimize a laser structure.

Several methods of arranging optical amplifiers not depending on polarization have been proposed. For example, japanese Laid-Open Patent Application No. 1-102983 discloses a method using a polarization rotation unit connected to the input of an optical amplifier. U.S. Pat. No. 4,886,334 discloses a method of splitting input light into two polarization components, inputting these two polarization components into separate optical amplifiers, and combining outputs from the optical amplifiers.

Various examples of the amplifiers not depending on polarization require complicated external optical components and electrical circuits, resulting in low productivity, high cost, and a large size resulting from an optical amplifier module. These problems are inevitably posed when polarization dependency of the amplification factor of the semiconductor optical amplifier is to be indirectly eliminated. Therefore, it is more effective to directly eliminate polarization dependency of the amplification factor of the semiconductor optical amplifier by optimizing a laser structure than using the above methods.

All conventional semiconductor optical amplifiers have been arranged by directly utilizing semiconductor laser structures. A semiconductor laser for performing laser oscillation is generally designed to positively utilize polarization dependency of a gain to stably oscillate a laser beam in a mode of a specific polarization direction. When a laser having the same structure of the above semiconductor laser is used as an optical amplifier, large polarization dependency of the gain occurs.

Factors causing polarization dependency of the gain in a semiconductor laser structure are given as follows:

(1) different confinement coefficients between different polarization modes;

(2) different end face reflectances between different polarization modes; and (3) different optical gains between different polarization modes.

In order to eliminate factors (1) and (2), it is effective to cause a light wave distribution to come close to a plane wave distribution in a waveguide or near an end face of the amplifier. For this purpose, the most general method is to increase the thickness of an active layer, thereby almost eliminating polarization dependency caused by the factors. Even if the thickness of the active layer itself is not increased, a specific layer structure around the active layer is employed to weaken the light confinement.

The factor (3) is caused by an active layer structure. Polarization dependency does not occur in a bulk active layer. However, when a quantum well structure is used in an active layer, regeneracy is released by a quantum effect to isolate heavy and light holes in a valence band. Light (TE light) having an electric field vector parallel to a quantum well plane has a larger gain than that of light (TM light) having an electric field vector perpendicular to the quantum well plane, thereby causing large polarization dependency.

Polarization dependency occurs when an electron/hole confinement direction is limited to one direction, i.e., when the quantum well structure is a one-dimensional quantum well structure for one-dimensionally confining carriers. Polarization dependency is eliminated in a two-dimensional quantum well structure (e.g., a quantum line structure) for confining electrons and holes in two directions.

When only polarization dependency caused by different optical gains as the factor (3) is taken into consideration, the active layer is arranged to have a bulk structure or a two-dimensional quantum well structure (e.g., a quantum line structure). Therefore, no problem is posed when the one-dimensional quantum well structure is not employed.

The one-dimensional quantum well structure is generally used in a semiconductor laser structure and is more advantageous in design and fabrication than a bulk structure. In addition, it is known that the one-dimensional quantum well structure as an optical amplifier can improve amplification characteristics. Effectiveness of the one-dimensional quantum well structure cannot be neglected.

Although a technique for fabricating a thin quantum line has been developed, two-dimensional confinement of carriers must be equally performed to obtain perfect nondependency on polarization. For this purpose, it is assumed that processing with a precision of several Å to several hundreds of Å must be achieved in a lateral direction perpendicular to a stacking direction. It is, however, very difficult to form such a thin quantum line.

When a conventional semiconductor optical amplifying apparatus structure is used without any modifications and is formed into a module, this module becomes inappropriate as described above. Even if the conventional apparatus structure is used in an optical communication system or network, quality of optical communication is degraded, and the system configuration becomes complicated.

SUMMARY OF THE INVENTION

It is an object of the present invention to provide a semiconductor optical amplifying apparatus which can solve the conventional problems described above, which does not have polarization dependency of a gain, and which is suitable for module formation.

In order to achieve the above object of the present invention, there is provided a semiconductor optical amplifying apparatus, comprising:

a substrate;

an active layer having a quantum well structure formed on the substrate, the active layer guiding first waveguide mode light and second waveguide mode light having a polarization direction perpendicular to that of the first waveguide mode light and amplifying the first waveguide mode light and the second waveguide mode light, the active layer having quantum wells such that projected quantization axes obtained by projecting quantization axes of the quantum wells thereof on a plane perpendicular to a light waveguide direction are inclined at 45° with respect to vibration directions of electric field vectors of the first waveguide mode light and the second waveguide mode light; and an electrode for supplying a current to the active layer.

According to another aspect of the present invention, there is provided a semiconductor optical amplifying apparatus, comprising:

a substrate;

an active layer having a quantum well structure formed on the substrate, the active layer guiding first waveguide mode light and second waveguide mode light having a polarization direction perpendicular to that of the first waveguide mode light and amplifying the first waveguide mode light and the second waveguide mode light, the active layer having a plurality of portions having different projected quantization axes obtained by projecting quantization axes on a plane perpendicular to the light waveguide direction, and the plurality of portions being arranged such that a sum of gains applied from the plurality of portions to the first waveguide mode light is equal to a sum of gains applied from the plurality of portions to the second waveguide mode light; and an electrode for supplying a current to the active layer.

According to still another aspect of the present invention, there is provided a semiconductor optical amplifying apparatus comprising:

a substrate;

an active layer having a quantum well layer and a barrier layer alternately formed on the substrate, the active layer guiding first waveguide mode light and second waveguide mode light having a polarization direction perpendicular to that of the first waveguide mode light and amplifying the first waveguide mode light and the second waveguide mode light, and the quantum well layer having a layer surface inclined at an angle of 45° with respect to vibration directions of electric field vectors of the first waveguide mode light and the second waveguide mode light; and an electrode for supplying a current to the active layer.

According to still another aspect of the present invention, there is provided a semiconductor optical amplifying apparatus comprising:

a substrate;

an active layer having a quantum well layer and a barrier layer alternately formed on the substrate, the active layer guiding first waveguide mode light and second waveguide mode light having a polarization direction perpendicular to that of the first waveguide mode light and amplifying the first waveguide mode light and the second waveguide mode light, the active layer having a plurality of portions whose quantum well layers are not parallel to each other, and the plurality of portions being arranged such that a sum of gains applied from the plurality of portions to the first waveguide mode light is equal to a sum of gains applied from the plurality of portions to the second waveguide mode light; and an electrode for supplying a current to the active layer.

According to still another object of the present invention, there is provided a semiconductor optical amplifying apparatus for waveguiding light and amplifying waveguided light, comprising:

a substrate consisting of a semiconductor of a first conductivity type and having a flat surface;

a first cladding layer formed on the flat surface of the substrate and consisting of a semiconductor of the first conductivity type, the first cladding layer having an upper side constituted by cyclic projections in a direction perpendicular to the light waveguide direction, and the cyclic projections being constituted by a plurality of nonparallel surfaces;

a semiconductor active layer having a quantum well structure formed on the cyclic projections of the first cladding layer;

a second cladding layer formed on the active layer and consisting of a semiconductor of a second conductivity type;

a first electrode formed on the second cladding layer; and a second electrode contacting the substrate.

BRIEF DESCRIPTION OF THE DRAWINGS

FIGS. 2A to 2C are schematic views showing a relationship between quantization axes and waveguide modes;

DETAILED DESCRIPTION OF THE PREFERRED EMBODIMENTS

Figure 1:
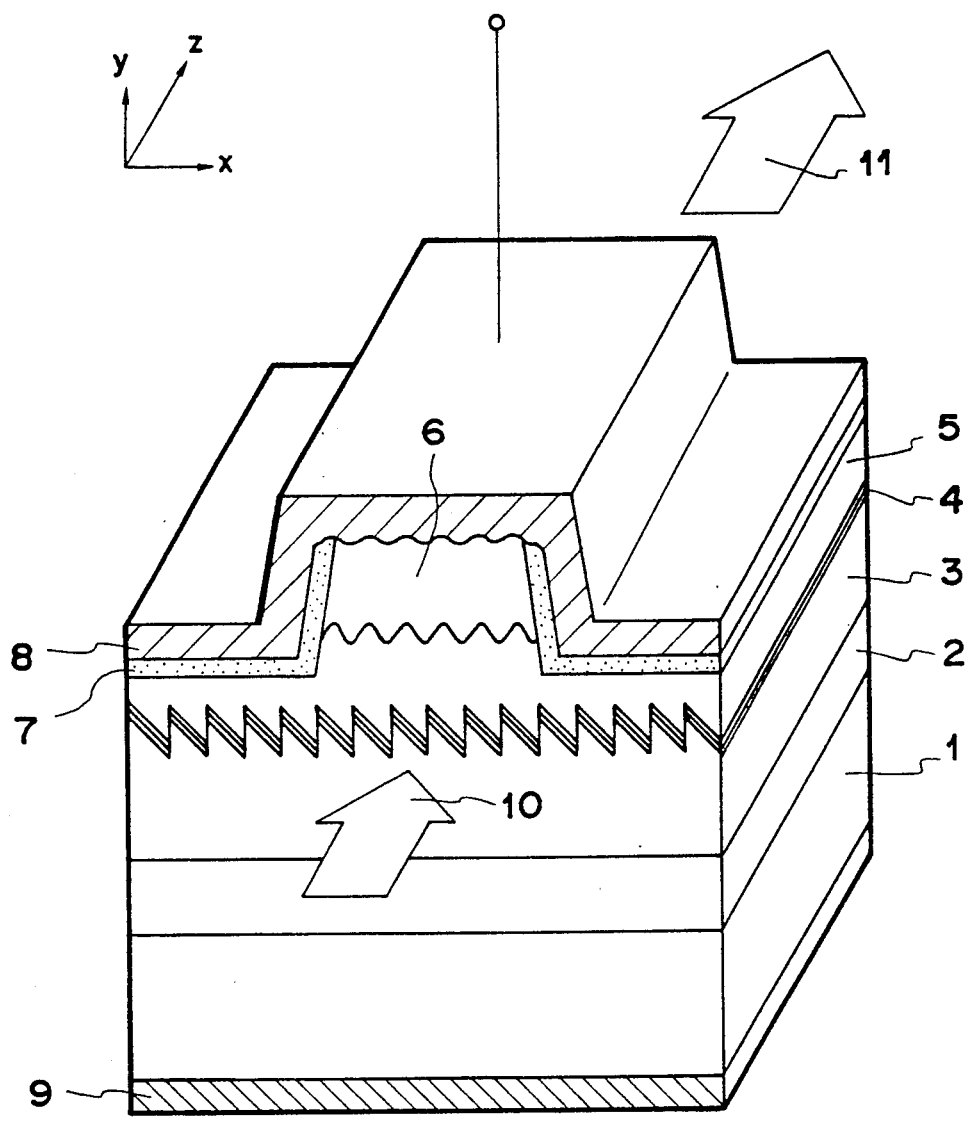
FIG. 1 is a schematic perspective view showing a semiconductor optical amplifying apparatus according to the first embodiment of the present invention.

In a semiconductor optical amplifying apparatus having a semiconductor laser structure for giving a gain to external input light, an active layer is formed to have a one-dimensional quantum well structure for confining carriers (electrons or holes) in a specific single direction. A quantization direction by a quantum well in the active layer is appropriately set so as to give uniform optical gains in waveguide modes having different polarization directions of light guided through the amplifier.

There are the following three methods as a method of uniforming a gain between two waveguide modes (i.e., typically TE and TM modes) having different polarization directions perpendicular to each other.

In the first method, the quantization axis of the quantum well which serves as the quantization direction perpendicular to an interface between the well and barrier which constitute a quantum well structure is projected on a plane perpendicular to the waveguide direction of the optical amplifying apparatus. The projected quantization axis is inclined at about 45° with respect to the vibration direction of the electric field vector present in the plane perpendicular to the waveguide mode directions having different polarization directions perpendicular to each other.

In the second method, a quantum well structure of the active layer is arranged so that a plurality of quantization axes of the quantum well are present. At the same time, a quantum well structure of the active layer is arranged such that a plurality of quantization axes obtained by projecting quantization axes on a plane perpendicular to the waveguide direction of the optical amplifying apparatus are present. The plurality of projected quantization axes constitute at least a pair of projected quantization axes within the plane perpendicular to the waveguide direction by using a pair of projected quantization axes perpendicular to each other as a unit. The respective quantum wells each having the pair of projected quantization axes have equal quantum effects except for the direction of the corresponding quantization axis.

In the third method, the plurality of projected quantization axes constitute at least one set of projected quantization axes within the plane perpendicular to the waveguide direction, the set being constituted by a plurality of quantization axes. The directions of quantization axes and lengths of regions of quantum wells are determined so that the quantum wells having the projected quantization axes constituting the set provide equal gains to the waveguide modes guided through the optical amplifying apparatus and having different polarization directions perpendicular to each other.

In the semiconductor optical amplifying apparatus according to the present invention, the direction of the quantization axis, the number of quantization axes, an angle formed by a plurality of quantization axes, the length of the region of each quantum well having different quantization axes, and the like in a region as a unit of the quantum well structure of the active layer are properly set. Basically, an optical gain free from polarization dependency can be obtained while a one-dimensional quantum well structure is used.

FIG. 1 is a perspective sectional view of a semiconductor optical amplifying apparatus according to the first embodiment of the present invention. Referring to FIG. 1, an n-GaAs buffer layer 2 and a 1.5-$\mu$m thick n-Al$_{0.3}$Ga$_{0.7}$As cladding layer 3 are deposited on an n-GaAs substrate 1 by molecular beam epitaxy (MBE). Stripes having a pitch of 0.3 $\mu$m are formed by photolithography, and etching is performed so that a surface inclined at an angle of 45° with respect to the substrate 1 is formed, thereby obtaining a saw-toothed three-dimensional surface shown in FIG. 1.

An active layer 4 of a multiple quantum well structure obtained by alternately depositing a 60-Å thick nondoped GaAs quantum well layer and a 100-Å thick Al$_{0.25}$Ga$_{0.75}$As barrier layer three times to sandwich a 0.5-$\mu$m thick Al$_{0.25}$Ga$_{0.75}$As layer (i.e., this layer serves as a barrier layer closest to the substrate 1), a 1.5-$\mu$m p-Al$_{0.3}$Ga$_{0.7}$As cladding layer 5, and a 0.2-$\mu$m thick p-GaAs capping layer 6 are sequentially formed by MBE.

In this case, the active layer 4 is stacked so as to extend on the inclined surface from the front side to the rear side in FIG. 1 but is not formed on the vertical surface of the saw-toothed three-dimensional surface. The upper surfaces of the cladding and capping layers 5 and 6 on the active layer 4 also have similar saw-toothed patterns (FIG. 1).

In order to obtain a ridge structure, both side portions are horizontally (FIG. 1) etched except for a central region having a strip width of 3 $\mu$m to a depth immediately above the active layer 4. At this time, a strip serving as the ridge structure is formed to extend in a direction parallel to an extension direction of the saw-toothed three-dimensional surface.

An insulating layer 7 is formed by a plasma CVD method to etch only a ridge top. A p-type electrode 8 and an n-type electrode 9 are deposited on the upper and lower surfaces of the resultant structure, respectively.

Finally, anti-reflection coating films (not shown) are finally formed on both end faces (i.e., faces opposite to the front surface in FIG. 1) of a chip by cleavage.

When a forward current having a threshold value or less is injected into the optical amplifying apparatus having the above structure of the first embodiment through the electrodes 8 and 9, this optical amplifying apparatus can be operated as a traveling wave optical amplifier for giving a high gain to input light 10 and outputting it as output light 11.

The active layer 4 deposited on the 45° inclined surface will be described in detail. The processing surface of the active layer 4 prior to its formation is sufficiently smooth. If formation conditions of the active layer 4 are determined to preserve its smoothness at the time of film formation, the active layer can have film quality equal to that of an active layer deposited on a flat surface except for the saw-toothed upper and lower ends.

As for confinement of electrons and holes, when the length of the inclined surface is set to be sufficiently larger than the thickness of the well layer and the barrier layer of the active layer 4, the same one-dimensional carrier confinement as in a conventional technique can be achieved except for the saw-toothed upper and lower ends. As for light confinement, a structure obtained by depositing an active layer on a flat surface can be equally applied such that the projections on the active layer 4 is much smaller than spreading of the electric field distributions in the direction lateral to the waveguide direction and in the layer stacking direction.

A change in effective refractive index caused by the ridge structure and a change in refractive index caused by the projections on the active layer 4 is present in the ridge structure. However, these projections are small, the change in refractive index caused by these projections is small, and light confinement can be effectively performed by the ridge structure. On the other hand, light confinement is performed by differences in refractive indices between the compositions of the respective layers in the layer stacking direction. A boundary between the projections of the active layer 4 is blurred, the effective difference in refractive index can be reduced, and an effective active layer thickness can be increased.

In the first embodiment, a structure in the layer stacking direction is a separate confinement heterostructure (SCH) to weaken light confinement and minimize a confinement coefficient and polarization dependency of the end face reflectance of the device. The micropatterned projections on the active layer 4 serve as a diffraction grating having a given lattice constant within a plane (drawing surface in FIG. 1) perpendicular to the waveguide direction. However, coupling to a reflected wave and a radiation mode does not almost occur.

The waveguide structure of the optical amplification apparatus of this embodiment may be regarded as a channel waveguide having a rectangular section as in a case wherein an active layer is stacked on a flat surface. In this case, a ratio of the short and long sides of this rectangle is large. Waveguide modes established in the waveguide path in this embodiment are two orthogonal waveguide modes (TE and TM modes) having different polarization directions and are separately processed.

Figure 3:
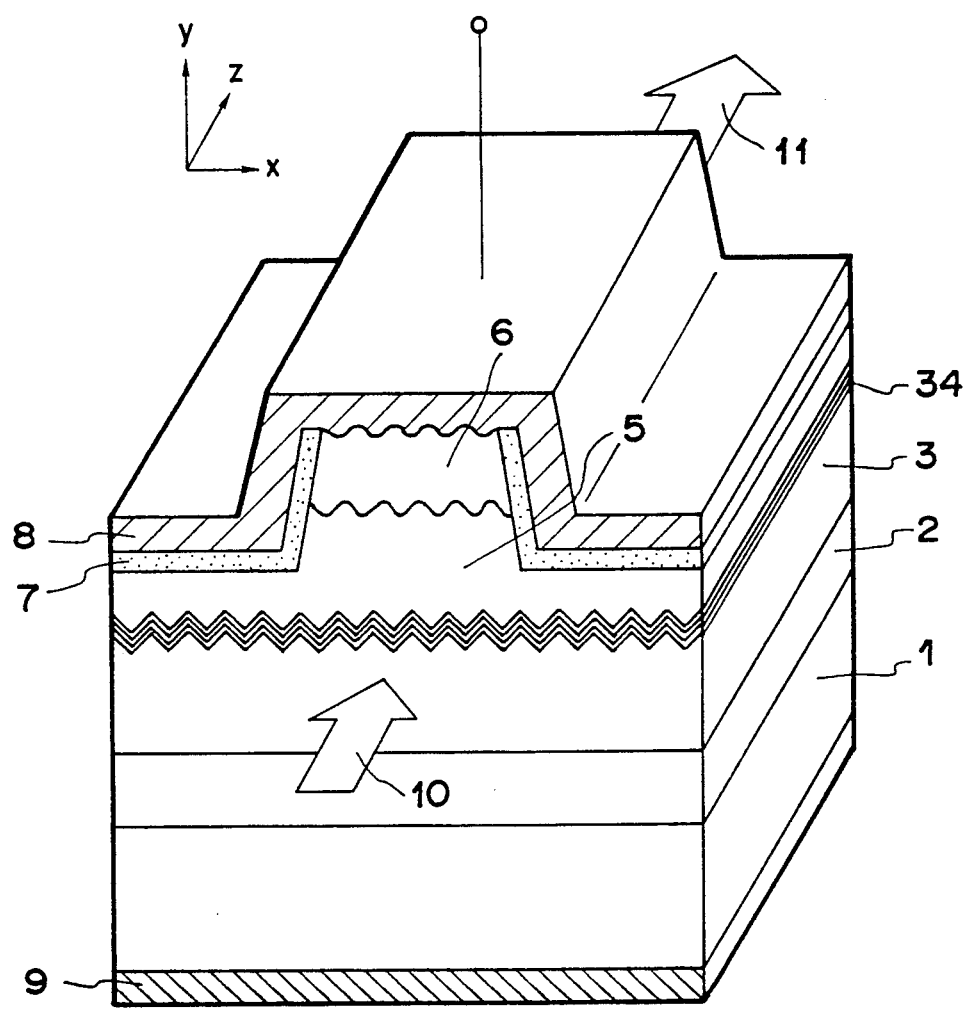
FIG. 3 is a schematic perspective view showing a semiconductor optical amplifying apparatus according to the second embodiment of the present invention.

No polarization dependency of the gain is present in these two waveguide modes, as will be described below. FIGS. 2A and 2B show sections of a part of the active layer 4. FIG. 2A shows a quantization axis of an active layer having a conventional quantum well structure, FIG. 2B shows an active layer having a quantum well structure of this embodiment and its quantization axis, and FIG. 3 shows electric field vectors in the TE and TM modes.

As in the conventional case, when a quantum well is formed on a flat surface, as shown in FIGS. 2A and 2C, a quantization axis 23 of the structure having well layers 21 and barrier layers 22 coincides with a direction of an electric field vector of one waveguide mode (i.e., the TM mode in this case). Different optical gains are obtained when the electric field vector is parallel and perpendicular to the quantum well structure layer. In the conventional case, a larger gain can be obtained in the TE mode wherein the vector is parallel to the quantum well (i.e., perpendicular to the quantum axis 23).

To the contrary, in the first embodiment, well layers 24 and barrier layers 25 of the quantum well structure are inclined by 45° with respect to the surface of a substrate 1. A quantization axis 26 is inclined by 45° accordingly with respect to the direction of the electric field vector in each waveguide mode. Therefore, a quantization effect is uniformly distributed in each waveguide mode, and a gain difference caused by the quantization effect in the polarization direction can be eliminated.

As in this embodiment, the quantum well is deposited on the 45° inclined surface, and the electric field vectors of the waveguide modes and the quantization axis 23 are inclined by 45° accordingly. There is, therefore, provided a semiconductor amplifying apparatus wherein the amplification characteristics of this embodiment are equal to those of the conventional one-dimensional quantum well structure, and the problem of polarization dependency of the optical gain can be solved. When this optical amplifying apparatus is used in an optical communication system or network using an optical fiber, an excellent system free from variations in output light can be obtained and will be described later on.

Since an active layer having a quantum well structure is used, performance of the optical amplifying apparatus can be expected to be improved as compared with an active layer having a bulk structure. For example, since an amount of current required to obtain a given gain can be reduced, and heat radiation and natural light radiation can be suppressed, noise characteristics can be improved, and a multi-stage arrangement can be advantageously obtained. A saturated output can also have a higher level, an amplification factor can be increased, and several wave-multiplexed signals can be simultaneously amplified. Therefore, an optical amplifying apparatus suitable for a long-distant, large-capacity optical communication system can be obtained.

The structure of this embodiment can be fabricated more easily than the two-dimensional quantum well structure (thin quantum line) and can be fabricated with good reproducibility by using a conventional fabrication technique.

A semiconductor optical amplifying apparatus according to the second embodiment will be described with reference to FIG. 3. In the second embodiment, an active layer 34 is formed to have a rectangular three-dimensional structure having an inclination angle of 45° at each of the right and left sides on the surface of a substrate 1. This embodiment is substantially the same as that of the first embodiment, except for the three-dimensional pattern of the active layer. More specifically, the second embodiment exemplifies the first method as in the first embodiment. The second embodiment has the same effect as in the first embodiment and additionally has the following advantages.

First, formation of the projections as the three-dimensional pattern of the active layer 34 can be facilitated. When shapes at the same pitch are taken into consideration, a triangular shape has an etching depth smaller than that of a saw-tooth shape. In addition, a symmetrical structure can be more easily obtained in the triangular shape than the saw-tooth shape. That is, in order to obtain a saw-tooth shape, anisotropic etching must be performed.

Second, the quality of the active layer 34 can be improved. In the first embodiment, the quantum well is interrupted, and disturbance of film deposition at the distal end portion tends to occur to form a defective active layer. In the second embodiment, however, since the quantum well continues without any interruption, the active layer has a structure almost free from defects.

In the first and second embodiments described above, the active layers are formed by the micropatterned cyclic three-dimensional structures. However, a quantum well structure need not be micropatterned or the length of the inclined surface need not be defined so as to obtain a desired effect of the semiconductor optical amplifying apparatus according to the present invention. The quantum well structure need not have a cyclic pattern, either.

When the length of the inclined surface is excessively increased, a waveguide along a quantum well surface appears, and an angle between an electric field vector of a waveguide mode and its quantization axis becomes almost zero. On the other hand, it is important to optimize carrier confinement so as to obtain a necessary optical gain. For this purpose, the length of the inclined surface needs to be relatively large. In addition, a cyclic pattern can be easily formed, thus providing a manufacturing advantage.

With the structures of the first and second embodiments, necessary amplifying characteristics can be obtained for practical applications. In addition, the fabrication process is relatively simple, and these embodiments are very effective for optical amplifying apparatuses of the present invention.

An embodiment belonging to the second method will be exemplified below. According to this method, a pair of quantum wells are dealt as a single quantum well. The single quantum well has two confinement directions and can solve the problem of polarization dependency of the gain as in the two-dimensional quantum well structure.

Figure 4A:
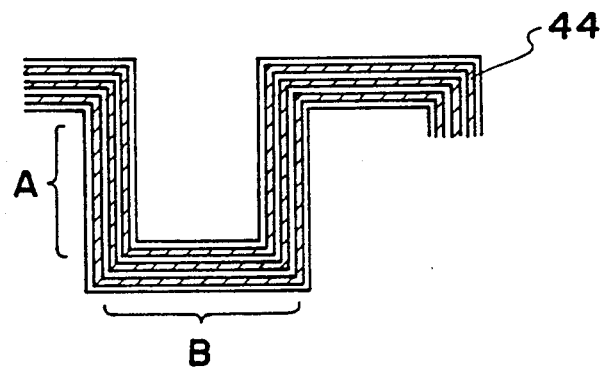
FIG. 4A is a schematic view showing an active layer on the third embodiment of the present invention.

The active layer structure of the third embodiment is shown in FIG. 4A. This embodiment has the same structure as in the first embodiment except for an active layer 44 shown in FIG. 4A. In the third embodiment, since a quantum well is also formed on a vertical surface, special care must be taken for its formation method.

Figure 4B:
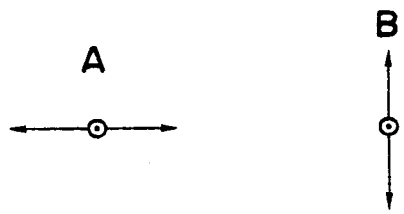
FIGS. 4B to 4D are schematic views showing a relationship between quantization axes and waveguide modes of the active layer.
Figure 4C:
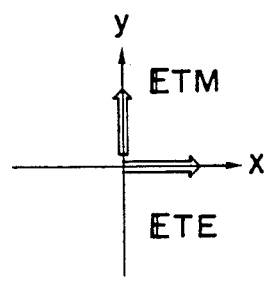
Figure 4D:
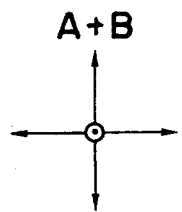

In the third embodiment, a quantum well is formed along a rectangular three-dimensional surface. The pitch and depth of the three-dimensional pattern are adjusted so that the length of a quantum well A formed on the vertical surface is equal to that of a quantum well B formed on the upper and lower surfaces. With this structure, the quantum wells A and B are paired. As shown in FIG. 4B, quantization axes of the quantum wells A and B are perpendicular to each other. The quantization axis of the quantum well A coincides with a direction of an electric field vector in the TE mode, and the quantization axis of the quantum well B coincides with a direction of an electric field vector in the TM mode (FIGS. 4B and 4C). Since gains of the quantum wells A and B are added to each other, a total gain of the quantum wells A and B compensates for polarization dependency of the gains of the quantum wells A and B each other, thereby nullifying a difference in gain between the TE and TM modes (FIG. 4D). Since the active layer 44 is dealt as a set of plural pairs using the quantum wells A and B as a unit pair, total polarization dependency of the gain of the optical amplifying area as a whole can be eliminated.

In this embodiment, it is important to establish an orthogonal relationship between the quantum wells constituting a pair and identical performance of both the quantum wells. The length of the quantum well A formed on the vertical surface must be equal to that of the quantum well B formed on the upper and lower surfaces. The thicknesses of the quantum well A and its barrier layer must be equal to those of the quantum B and its barrier layer. If the performance of the quantum well A is different from that of the quantum well B, polarization dependency of the gain cannot be perfectly eliminated, and the amplification characteristics are degraded.

In the third embodiment, the direction of the quantization axis is matched with the direction of the electric field vector of each waveguide mode. In the second method, however, the quantization axis may be inclined by an arbitrary angle with respect to the direction of the electric field vector of each waveguide mode. The direction of the quantization axis is inclined by 45° with respect to the direction of the electric field vector, as described with reference to the second embodiment. This indicates that the second embodiment exemplifies not only the first method but also the second method.

The fourth embodiment employing the third method will be described with reference to FIGS. 5A to 5D. The fourth embodiment has the same structure as in the first embodiment except for an active layer 54 shown in FIG. 5A.

Figure 5A:
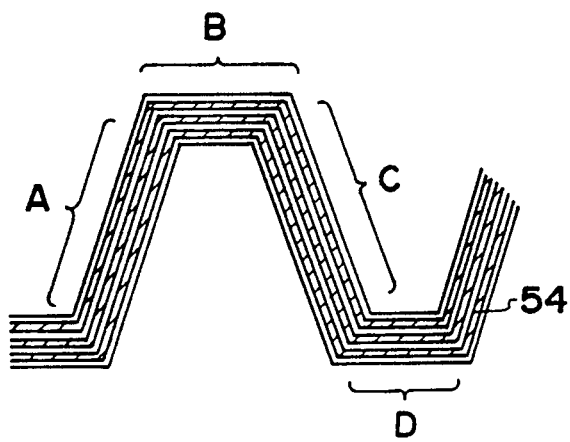
FIG. 5A is a schematic view showing an active layer of the fourth embodiment of the present invention.
Figure 5B:
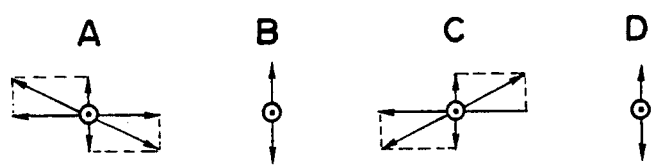
FIGS. 5B to 5D are schematic views showing a relationship between quantization axes and waveguide modes of the active layer.
Figure 5C:
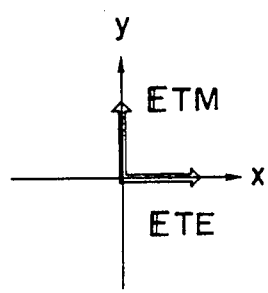
Figure 5D:
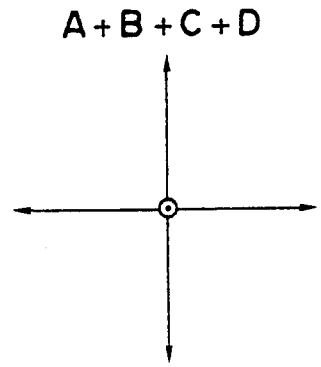

In this embodiment, quantum wells are formed along a trapezoidal shape, and quantum wells A, B, C, and D constitute a set of quantum wells serving as a single quantum well. The trapezoidal shape may be appropriately set so that the set of wells give a gain corresponding to a TE or TM mode. More specifically, gains obtained from the quantum wells A, B, C, and D are decomposed into TE and TM components (FIG. 5B; horizontal and vertical lengths correspond to gains corresponding to TM and TE modes, respectively). The pitch, depth, and inclination angle of the trapezoidal shape are determined so that a sum of TE vector components is set equal to that of TM vector components (FIG. 5D). In this embodiment, the pitch, depth, and inclination angle were 0.3 μm, 0.19 μm, and 60°, respectively. In the fourth embodiment, the structures (thickness and composition) of the quantum wells A, B, C, and D must be equal to each other.

In the third method, the shape of the active layer for eliminating polarization dependency of the gain is not limited to a trapezoidal shape, but can be variously changed. In each of the first to fourth embodiments, the shape of the three-dimensional surface is formed by processing the cladding layer. However, any other method may be employed.

For example, the surface of the substrate 1 may be directly etched. In this case, a special care is taken for the buffer layer 2 from the surface of the substrate 1 to the active layer to reduce the defects. After a layer having a three-dimensional pattern is formed on a cladding layer by deposition or the like, an active layer may be grown again. In addition, the flat surface may be chemically treated to change growth conditions. Alternatively, growth conditions may be changed by a change in crystal orientation.

A laser structure may be changed in a layer stacking direction and a lateral direction. For example, a separate confinement heterostructure (SCH) in the layer stacking direction may be flattened. For this purpose, after the active layer is deposited, a growth method which flattens the growth surface is selected. Confinement in the layer stacking direction can be defined by the interface of the SCH layer. Any quantum well structure within the active layer does not contribute to light confinement, and a waveguide mode can be accurately defined.

Similarly, when a laser structure may be constituted not by a ridge structure but by an embedded structure, light confinement in the lateral direction can be accurately and effectively performed.

A material is not limited to a GaAs-based material, but can be a Group III-V material including an InP-based material. The optical amplifying apparatus is not limited to a traveling wave type apparatus, but can be utilized as any other optical amplifier. For example, when a coating free from polarization dependency upon its reflection and having a high reflectance is formed on an end face, the optical amplifying apparatus can be utilized as a resonant optical amplifying apparatus free from polarization dependency. In addition, a grating may be formed on the optical amplifying apparatus in the direction of a resonator to constitute a wavelength selection type optical amplifying apparatus. In this case, a separate grating may be formed around a cladding layer. However, a three-dimensional structure of an active layer may be formed in the direction of the resonator at an appropriate pitch, thereby forming a grating. In the latter case, the effect of the optical amplifying apparatus of the present invention can be obtained, and no structural problem is posed.

Figure 6:
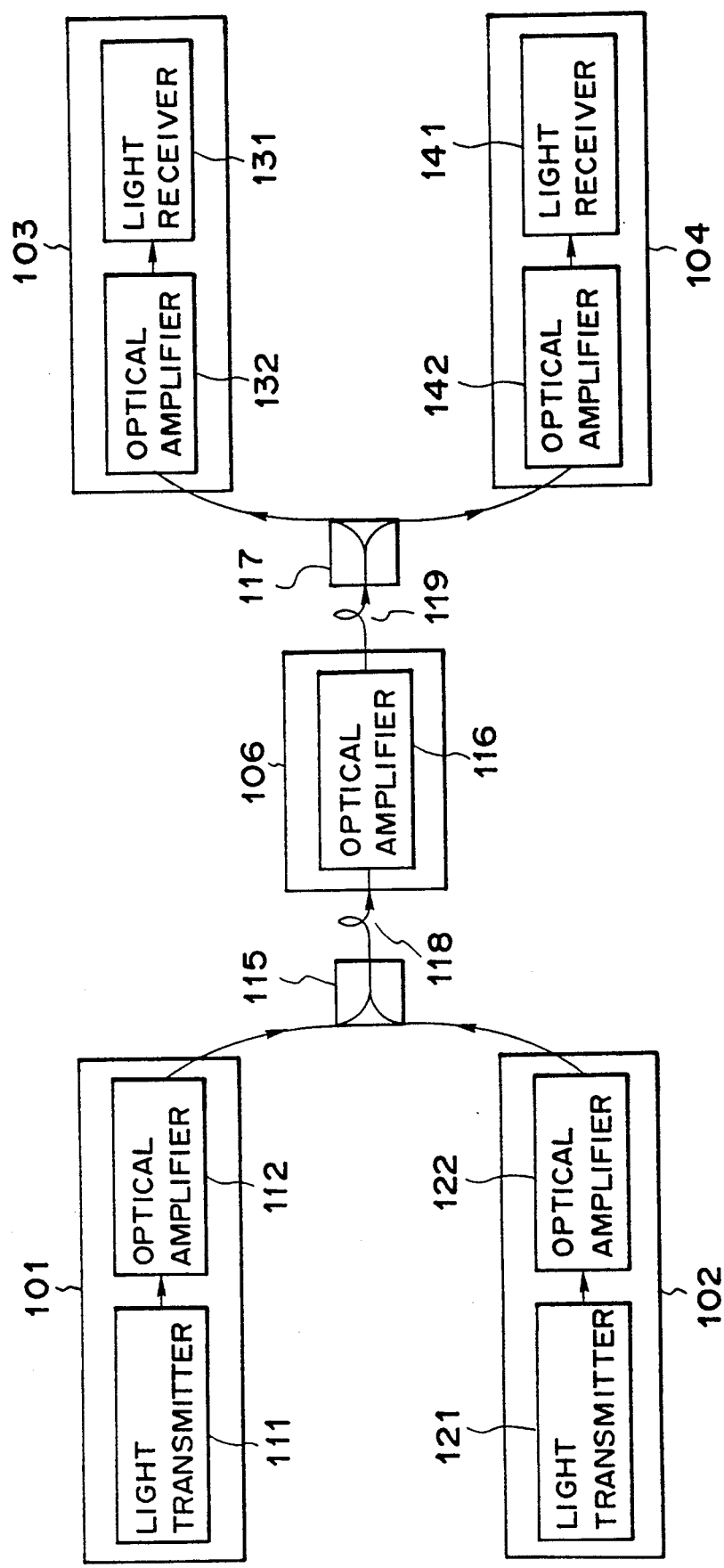
FIG. 6 is a block diagram showing an optical communication system using the optical amplifying apparatus according to the present invention.

Next, FIG. 6 shows an optical communication system in which the above optical amplifying apparatus is used. In FIG. 6, the reference numerals 101 and 102 are transmitters, reference numerals 115 and 117 are branch-combine devices, reference numeral 106 is a repeater equipment, reference numerals 103 and 104 are receivers, and reference numerals 118 and 119 are optical transmission lines. The transmitters 101 and 102 respectively include light transmitters 111 and 121 which are provided with a signal processing portion or processor and an electro-optical converting portion or transducer and optical amplifying devices 112 and 122 for amplifying light signal output from the light transmitters 111 and 121. The receivers 103 and 104 respectively comprise optical amplifying devices 132 and 142 for amplifying input signal and light receivers 131 and 141 which involve an opto-electric transducer and a signal processing portion.

In the optical communication system of FIG. 6, light signals output from the light transmitters 111 and 121 are amplified by the amplifying devices 112 and 122 and are output from the transmitters 101 and 102. The output signals are so controlled that they do not collide with each other on the transmission line 118, using a prescribed multiplexing system, such as time division multiplexing, frequency division multiplexing. CSMA/CD (carrier sense multiple access/collision detection), etc., and they are sent to the transmission line 118 through the branching-combining device 115. When the light signal is transmitted in the transmission line 118, the light is attenuated, so that the light signal is amplified by the repeater equipment 106. In the FIG. 11, only one repeater equipment 106 is disposed, but if necessary, the repeater equipment 106 may be disposed at plural locations. Or, no repeater equipment can be used, if unnecessary.

The light signal amplified by the repeater equipment 106 is input into the branching-combining device 117 through the light transmission line 119 and is separated by such a separation method as corresponds to the multiplexing system to be input into the receivers 103 and 104. The light signal input to each receive end office 103 and 104 is amplified by the optical amplifiers 132 and 142 to compensate for losses generated in the light transmission line 119 and the branching-combining device 117 to be input into the light receivers 131 and 141. Thus, the communications from the transmitter 101 to the receive end office 103 and from the transmit end office 102 to the receiver 104 are conducted through the single light transmission line 118 and 119.

In FIG. 6, there are two transmitters and two receivers, but the branch number of the branching-combining devices 115 and 117 may be increased to attain an N to N communication by using N number of transmitters and N number of receivers. Further, one to one communication is also possible without using the branching-combining devices 115 and 117. In FIG. 6, there is no need to dispose the optical amplifying apparatus in all illustrated locations. This apparatus has only to be disposed in such location where signal attenuation at each part should be compensated for.

When the polarization insensitive optical amplifying apparatus is used in the optical communication system as shown in FIG. 6, the light receiver in the system will not be given much burden regarding the dynamic range and the like because, even if the amplifying apparatus receives an unstable signal light in its state of polarization the output therefrom is always being amplified to a constant level.

Further, a preferable optical communication system is attained, and there is no limitation to the scale of the system since there is no power fluctuation in the light signal. Since the polarization dependency is solved without degrading characteristics other than the gain characteristic, such as noise characteristic, either, the system is still preferable also in this point. Moreover, there is no need to use means or apparatuses specially devised in coping with the fluctuation in state of polarization, as signal processing means, E/O and O/E converting means, optical transmission line, etc., because the polarization insensitive amplifier is used in the system. As those means, conventional ones can be used.

Figure 7:
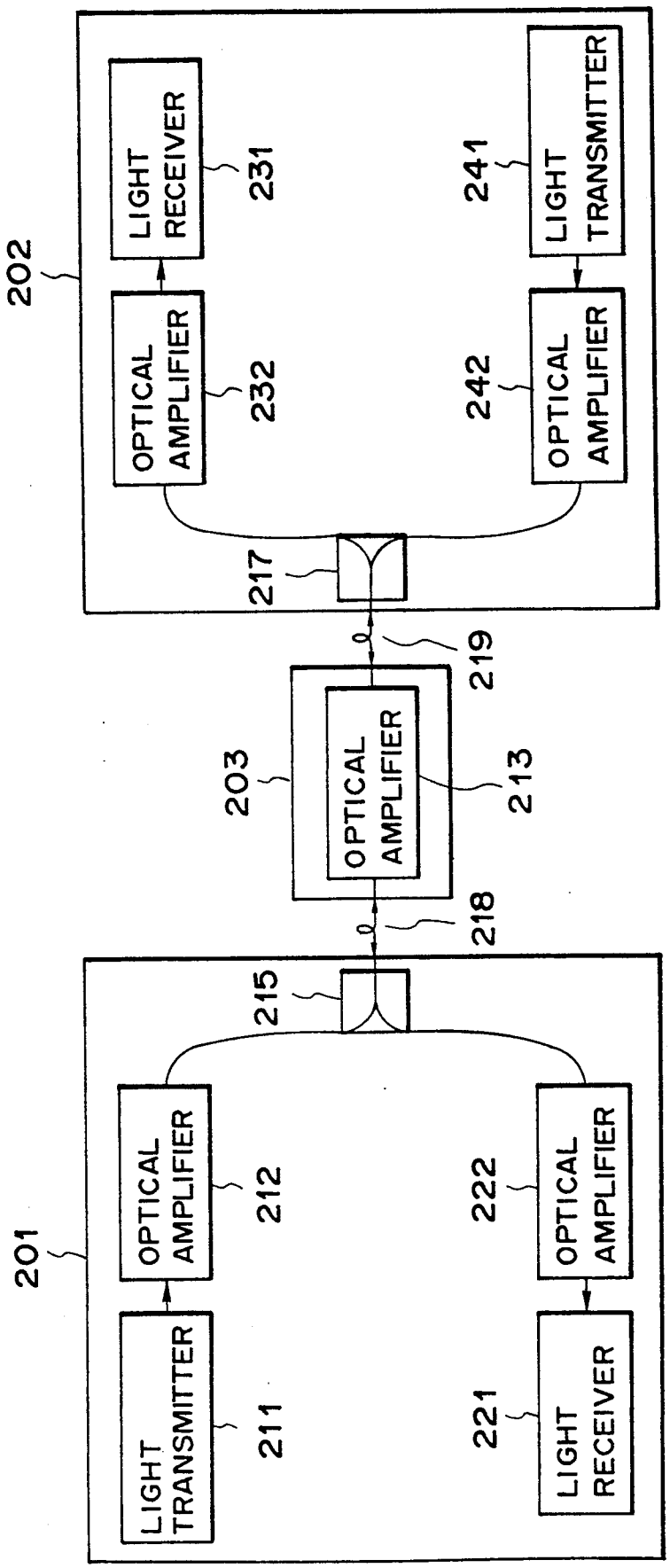
FIG. 7 is a block diagram showing a bidirectional optical communication system using the optical amplifying apparatus according to the present invention.

FIG. 7 shows the example of a bidirectional optical communication system in which the polarization insensitive amplifying apparatus of this invention is employed. In the optical communication system shown in FIG. 7, the reference numerals 201 and 202 are transceivers, reference numeral 203 is a repeater equipment, and reference numerals 218 and 219 are optical transmission lines. The transceivers 201 and 202 respectively include transmit parts and receive parts, and the transmit part consists of light transmitters 211 and 241 which involve a signal processor and a E/O converting portion, and optical amplifiers 212 and 242 for amplifying the signal output from the light transmitters 211 and 241. The receive part consists of optical amplifiers 222 and 232 for amplifying the input light signal and light receivers 221 and 231 which include an O/E converting portion and a signal processor. In the transceivers 201 and 202, the transmit and receive parts are connected by branch-combine devices 215 and 217. The repeater equipment 203 includes an optical amplifier 213 and is connected to each transceiver 201 and 202 through the optical transmission lines 218 and 219.

In the structure of FIG. 7, light signals output from the light transmitter 211 in the transceiver 201 and the light transmitter 241 in the transceiver 202 are respectively amplified by the optical amplifiers 212 and 242 and are sent out from each transceiver 201 and 202 through the branch-combine devices 215 and 217. These output light signals are respectively transmitted in opposite directions through the optical transmission lines 218 and 219. The light signals are amplified by the repeater equipment 203 since their light amounts are attenuated when the light signals are transmitted through the transmission lines 218 and 219.

In FIG. 7, the repeater equipment 203 is disposed in one location, but if necessary, this can be placed in plural locations. If the repeater equipment is not needed, this may be omitted. The light signals amplified by the repeater equipment 203 are further transmitted through the transmission lines 219 and 218 and input to the transceivers 202 and 201 at the opposite sides. The input signals are branched off by the branch-combine devices 217 and 215 in the directions to the light receivers 231 and 221, are amplified by the optical amplifiers 232 and 222 in order to compensate for losses caused in the transmission lines 218 and 219 and the branch-combine devices 215 and 217 and are input into the light receivers 231 and 221. Thus, the bidirectional communication is performed between the transceivers 201 and 202 through a single transmission line 218 and 219.

In FIG. 7, there is illustrated the example of a bidirectional communication in which two transceivers are provided with each having one transmit part and one receive part. But, such structures are possible wherein each transceiver involves plural transmit parts and receive parts or wherein plural transceivers are connected by the branching-combining device. There is no need to dispose the optical amplifiers in all illustrated locations in FIG. 7, and the amplifier has only to be disposed where the attenuation of the light signal need be compensated for. For the rest, the system of FIG. 7 is the same with that of FIG. 6.

Figure 8:
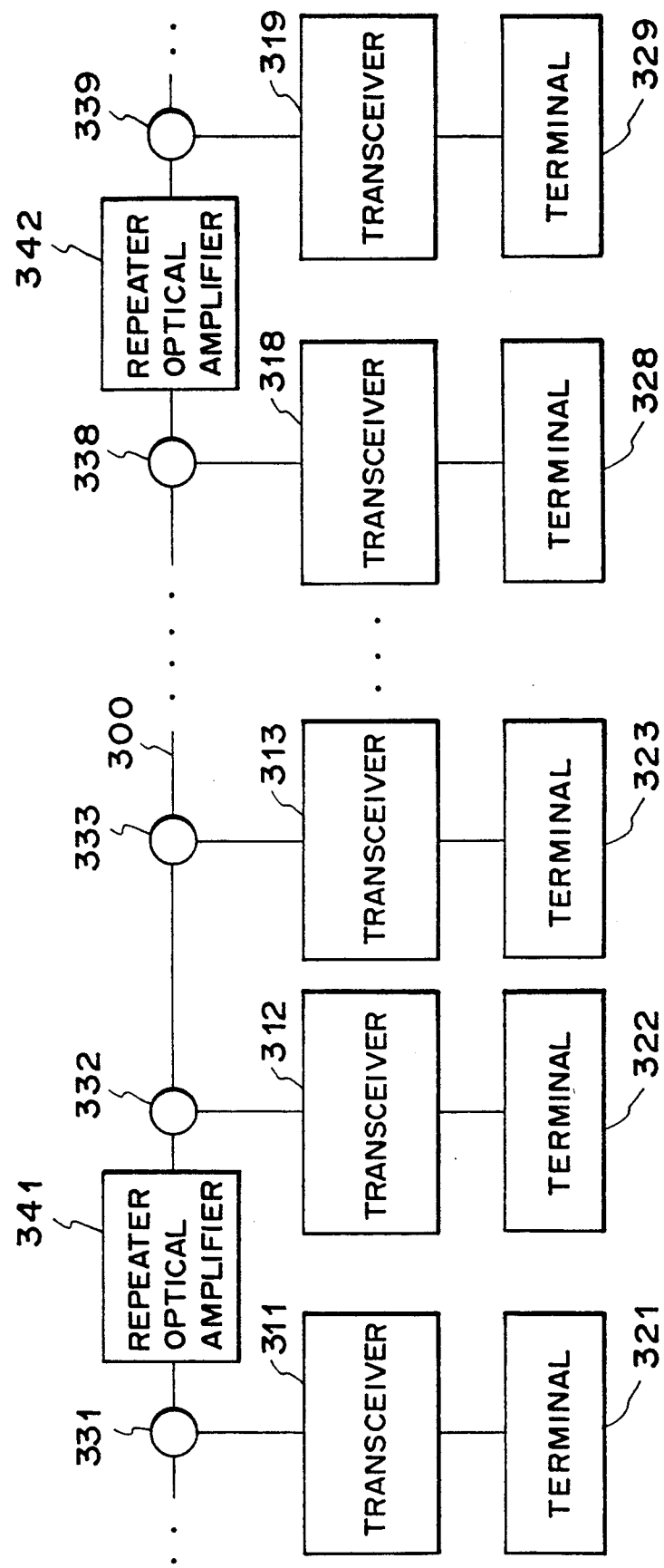
FIG. 8 is a block diagram showing a bus type optical communication network using the optical amplifying apparatus according to the present invention.
Figure 9:
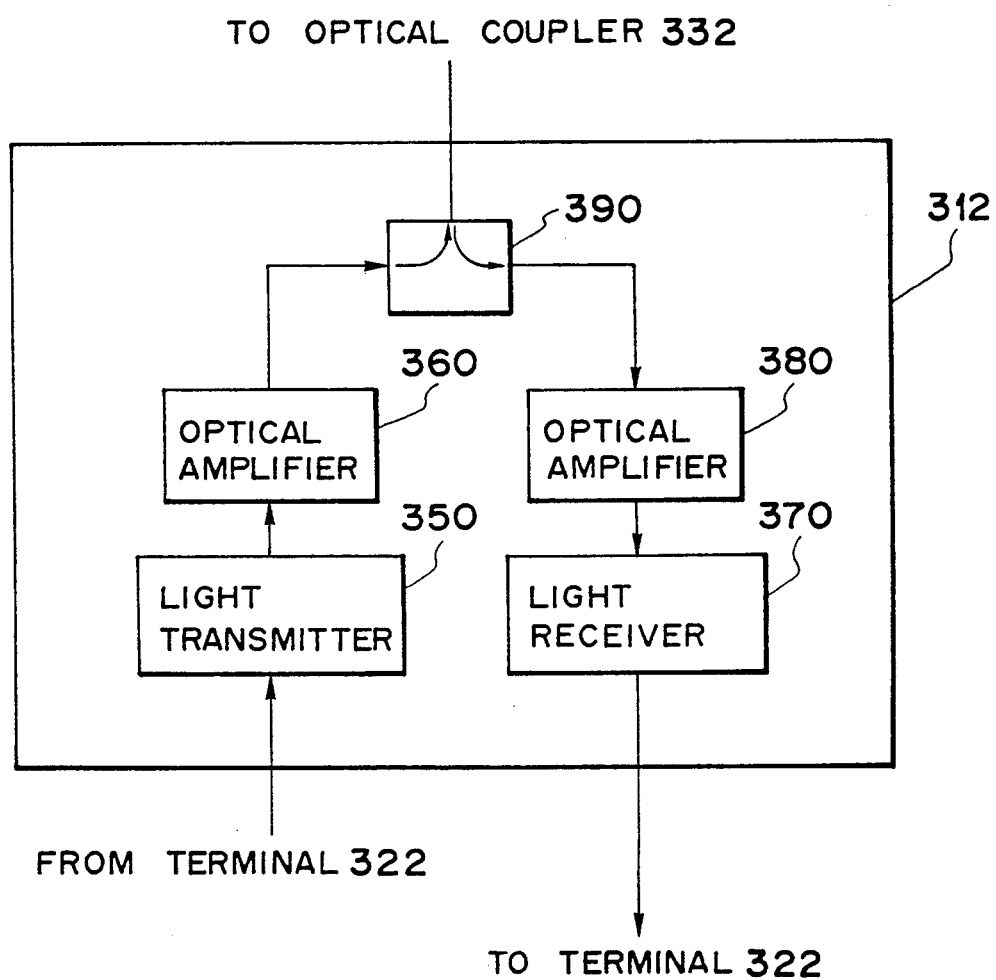
FIG. 9 is a block diagram showing an arrangement of a transceiver in the network shown in FIG. 8.

FIGS. 8 and 9 show a bus-type optical communication network in which the polarization insensitive type optical amplifying apparatus of this invention is used.

In FIG. 8 showing the overall system, the reference numeral 300 is an optical transmission line composed of such as optical fibers, reference numerals 311-319 are respectively transceivers which convert electric signals from terminals 321-329 to light signals to send them out to the transmission line 300, convert the light signal on the transmission line to the electric signal to transfer it to the terminal, and detect the condition of communication on the optical transmission line 300 to control the communication in such a manner that signals from other terminals will not collide with the signal from the own terminal. Further, the reference numerals 331-339 are respectively optical couplers which are connected to the transmission line 300, take out part of the signal on the optical transmission line 300 to transmit it to the transceivers 311-319 and send out to the transmission line 300 the light signals from the transceivers 311-319. The reference numerals 321-342 are respectively repeater optical amplifiers for amplifying the light signal on the transmission line 300 to transmit it, and the polarization insensitive optical amplifying apparatus is used as those repeater optical amplifiers 341-342.

FIG. 9 illustrates one example of the structure of the transceiver 312 in FIG. 8. In FIG. 9, the reference numeral 350 is a light transmitter which converts the signal from the terminal 322 to an optical signal and transmits this light signal to the transmission line by controlling in such a manner that the signals from the other terminals will not collide with that light signal on the optical transmission line 300, reference numeral 360 is an optical amplifier for amplifying the light signal from the light transmitter 350, reference numeral 370 is a light receiver which converts the light signal transmitted through the transmission line 300 to an electric signal and transmits this electric signal to its own terminal if the signal is addressed to the own terminal (in this case terminal 322) which is connected to its own transceiver 312, reference numeral 380 is an optical amplifier for amplifying the signal transmitted through the transmission line 300 to transmit it to the light receiver 370, reference numeral 390 is a branch-combine device for sending out the optical signal from the amplifier 360 to the coupler (in this case coupler 332) and transmitting the optical signal from the optical coupler 332 to the amplifier 380. The polarization insensitive type optical amplifying apparatus of this invention is utilized as the optical amplifiers 360 and 380. Here, only the structure of the transceiver 312 is explained, but the other transceivers 311-319 also have similar structures.

The operation of this embodiment will be explained, assuming that the communication is performed between the terminals 322 and 329. Where the signal is to be transmitted from the terminal 322, first the light transmitter 350 does such control that the signal from the terminal 322 will not collide with the signals from the other terminals on the optical transmission line 300 preferably using a prescribed multiplexing system such as the time division multiplexing, frequency division multiplexing and CSMA/CD, and converts the signal from the terminal 322 to an optical signal to transmit it to the optical amplifier 360. This signal is amplified by the optical amplifier 360 to be sent out on the optical transmission line 300 in opposite directions by the optical coupler 332 through the branch-combine device 390. This optical signal reaches the repeater optical amplifier 342 through the couplers 333, ..., 338. At this time, part of this optical signal's power is branched by each optical coupler to be transmitted to the transceivers 313, ..., 318, and these transceivers recognize that this signal is not addressed to their own terminals 323, ..., 328 to abandon this optical signal. The optical signal arrived at the repeater optical amplifier 342 is lowered in its signal intensity since part thereof is branched at each optical coupler, but its intensity is regained by the amplification at the repeat optical amplifier 342 and the thus regained signal is transmitted to the optical coupler 339 through the transmission line 300.

At the optical coupler 339, part of the optical signal is branched to be transmitted to the transceiver 319, and is sent to the light receiver through devices similar to the branch-combine device 390 shown in FIG. 9. In this light receiver, the transmitted optical signal is converted to an electric signal, and the light receiver recognizes that this signal is addressed to the terminal 329 and transmits it to the terminal 329.

Where the signal is transmitted from the terminal 329 to the terminal 322, the signal is transmitted on the transmission line 300 in the opposite directions based on a process similar to that mentioned above. Here, the optical signal reaching the transceiver 312 passes through the optical couplers 338, . . . , 333 and 332 and thereafter through the optical branch-combine device 390, so that the signal is attenuated at each part and its intensity is weakened. But, the signal is amplified by the optical amplifier 380 before reaching the light receiver 370, and is transmitted to the light receiver 370 after its intensity is regained.

Thus, the amplifier 360 amplifies the signal from the light transmitter 350 to transmit it to the transmission line 300, and the optical amplifiers 341, 342 and 380 compensate for the attenuation of light power caused in the path of light signal including the optical node to amplify the optical signal in such a manner that this has enough power to be received. Several advantages are achieved similar to those in the systems of FIGS. 6 and 7.

In this embodiment, the optical amplifiers are disposed right after the light transmitter 350, just before the light receiver 370 and on the optical transmission line 300, but, for example, if the light transmitter 350 can transmit the optical signal having sufficient power, the optical amplifier 360 is unnecessary. Further, if the output from the branch-combine device 390 has enough power to be received by the light receiver 370, the amplifier 380 is also dispensable. Further, if the number of optical couplers on the transmission line 300 is small, and the attenuation at the optical couplers is not critical, the optical amplifiers 341 and 342 on the transmission line 300 can also be omitted. Thus, all the amplifiers shown in FIGS. 8 and 9 are not necessary. When at least one of them is used, the bus-type optical communication network can achieve the above-mentioned advantages.

In the system of FIG. 8, the repeater optical amplifiers 341 and 342 are disposed on the optical transmission line 300 separately from the optical couplers 331, . . . , 339. But also where the repeater optical amplifier is contained in each optical coupler, the above-mentioned advantages can be attained only if the optical amplifying apparatus of this invention is used in the system.

In this embodiment, only a single transmission line 300 is used, but the above advantages can be attained also where the bidirectional communication or multiplexing communication is performed using, for example, plural optical fibers as optical transmission lines.

Figure 10:
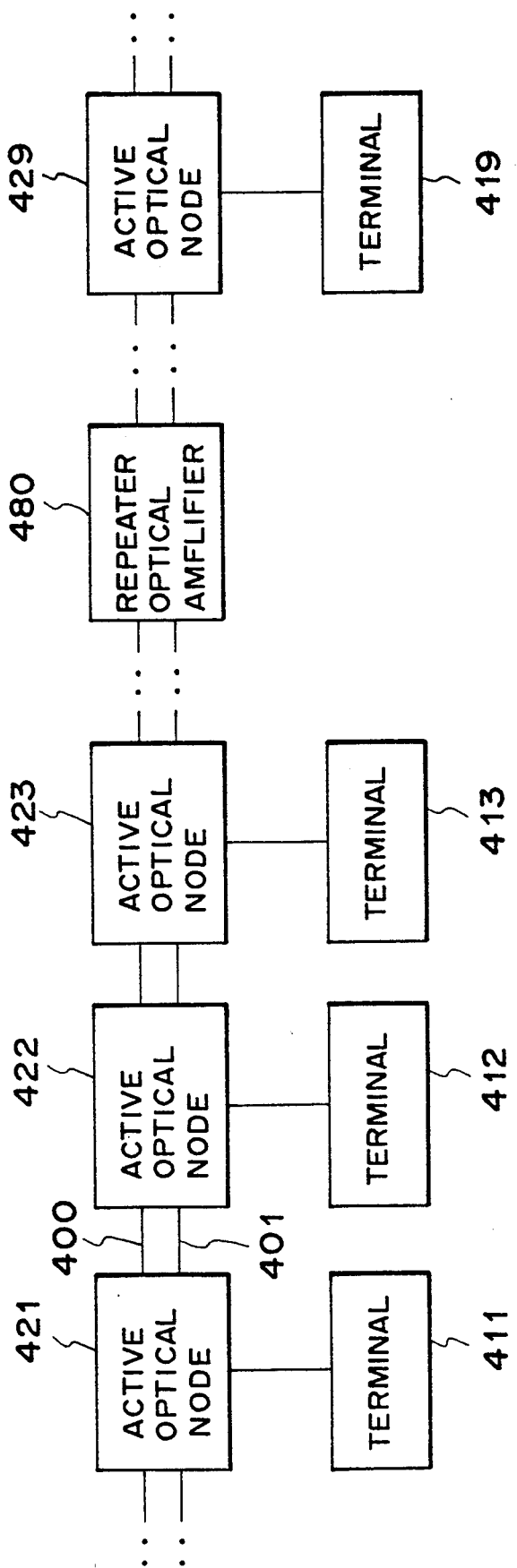
FIG. 10 is a block diagram showing a bus type optical communication network using an active optical node incorporating the optical amplifying apparatus according to the present invention.
Figure 11:
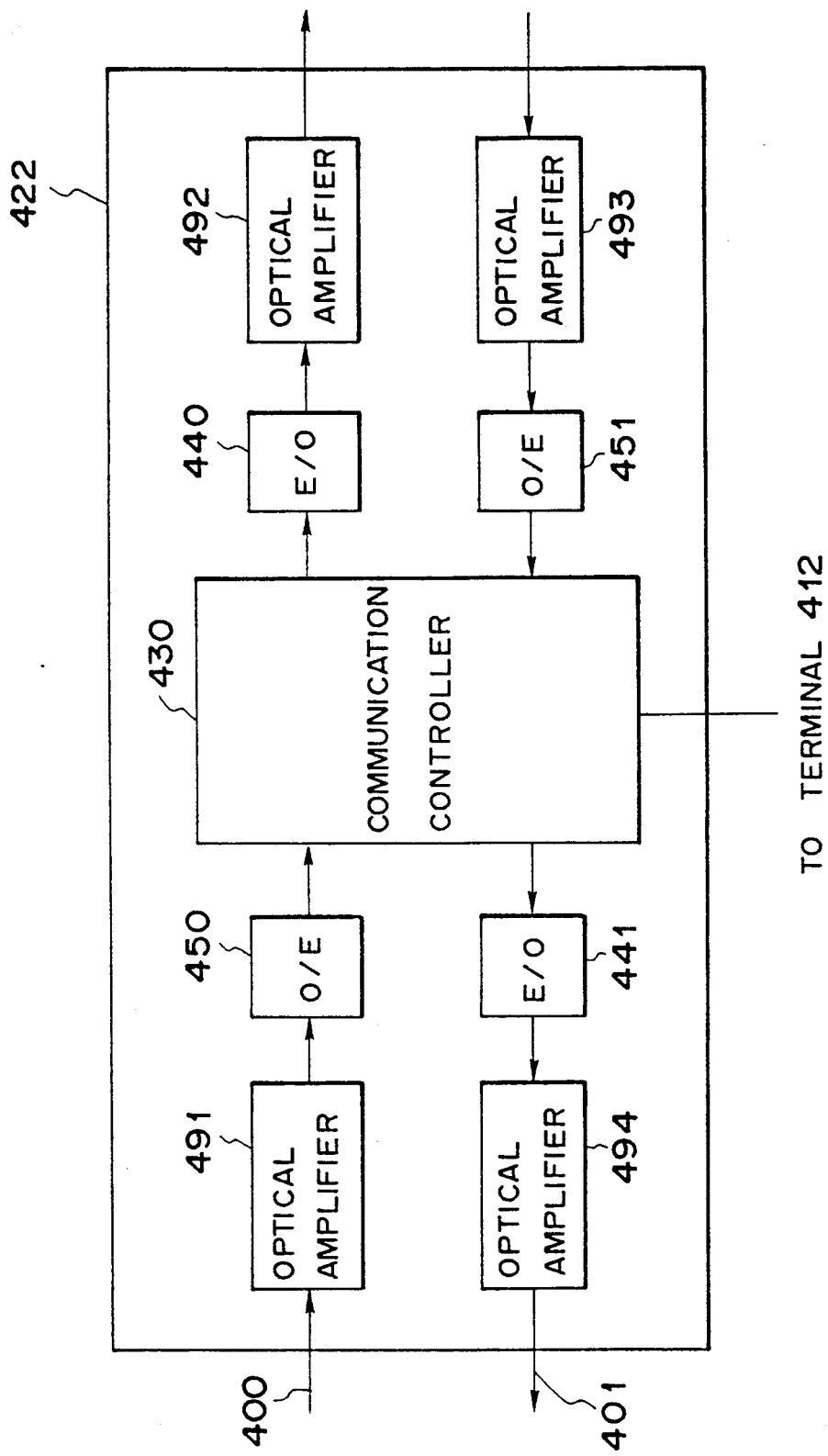
FIG. 11 is a block diagram showing the arrangement of an active optical node shown in FIG. 10.

FIGS. 10 and 11 show the example of an active bus-type optical communication network in which the polarization insensitive optical amplifying apparatus is used. In FIG. 10 illustrating the overall structure of the system, the reference numerals 400 and 401 are optical transmission lines such as optical fibers, reference numerals 411, . . . , 419 are terminals for performing communication, reference numerals 421, . . . , 429 are active optical nodes for conducting light transmission, light receiving and communication control, and reference numeral 480 is a repeater optical amplifier for amplifying the optical signal. In FIG. 11 which shows, as an example, the structure of one 422 of the active optical nodes, the reference numerals 450 and 451 are optoelectric converters (O/E) for converting the optical signal to the electric signal, reference numerals 440 and 441 are electro-optical converters (E/O) for converting the electric signal to the optical signal, and reference numeral 430 is a communication controller. The controller 430 discriminates if the signal transmitted through the transmission lines 400 and 401 and converted to the electric signal is addressed to the terminal 412, and if so, the controller 430 transmits the signal to the terminal 412 and if not so, the controller 430 again converts the signal to the optical signal using the E/O devices 440 and 441 to transmit this signal to the optical transmission lines 400 and 401. Further, when the signal is transmitted to the controller 430 from the terminal 412, the controller 430 converts the signal to the optical signal using the E/O devices 440 and 441 and transmits it to the transmission lines 400 and 401 under such control that the signal will not collide with the optical signals from the other terminals. The reference numerals 491–494 are optical amplifiers of the polarization insensitive type.

The operation of this embodiment will be explained, taking the case in which the signal is transmitted from the terminal 412 to the terminal 419, as an example. When the signal is output from the terminal 412, the communication controller 430 in the active optical node converts the signal from the terminal 412 to the optical signal by the E/O devices 440 and 441, amplifies this signal by the optical amplifiers 492 and 494 and transmits it on the optical transmission lines 400 and 401 in opposite directions, under such control that the signal from the terminal 412 will not collide with the signals from the other terminals on the transmission lines 400 and 401, using a prescribed multiplexing system such as time division multiplexing, frequency division multiplexing and CSMA/CD. This signal enters the active optical nodes 421 and 423, and is once converted to the electric signal to be input into the communication controller in the active optical nodes 421 and 423. However, this signal is not addressed to the terminal 411 and 413, the signal is once again converted to the optical signal to be sent out to the optical transmission line.

The distance between the terminals 423 and 429 is long, so that the optical signal loses its intensity in the optical fiber. To amplify this signal and compensate for the loss, the repeater optical amplifier 480 is amplified by the optical amplifier in the active optical node 429 and is then converted to the electric signal to reach the communication controller. The communication controller in the active optical node 429 recognizes that this signal is addressed to the terminal 419, and transmits it to the terminal 419. On the other hand, the signal sent out to the active optical node 421 from the node 422 through the transmission line 401 consecutively passes the active optical nodes and reaches the left end of the communication system. There, the signal is abandoned.

Thus, the optical transmission line 400 shares the signal transmission in the right direction in FIG. 10, and the line 401 shares that in the left direction. Therefore, signals output from any terminal are simultaneously transmitted in opposite directions, so they reach the addressed terminals without failure.

In the above manner, the optical amplifiers 492 and 494 amplify the signals from the E/O devices 440 and 441 to transmit them on the transmission lines 400 and 401, and the amplifiers 491 and 493 amplify the optical signals so that the attenuation of light power in the transmission line is compensated for and that they have enough power to be received. Further, the repeater amplifier 480 compensates for light losses where the distance between the active optical nodes is long. The polarization insensitive amplifying apparatus of this invention is used as the above optical amplifiers.

In the system of this embodiment, above-mentioned several advantages can be attained similarly to the systems of FIGS. 6 and 7.

In this embodiment, the optical amplifiers are disposed in several locations as shown in FIGS. 10 and 11, but, for example, if the E/O devices 440 and 441 can output the optical signal of enough power, there is no need to dispose the amplifiers 492 and 494. If the active node receives enough power so that the O/E devices 450 and 451 can receive it, the optical amplifiers 491 and 493 can be omitted. Further, if the distance between the terminals is not so long as to make losses in optical fibers considerable, the repeater optical amplifier 480 is dispensable. Thus, only if at least one amplifier is used, the active bus-type optical communication network can obtain the above-mentioned advantages.

In the system of FIG. 10, there are two transmission lines between the active optical nodes to perform the bidirectional communication. But also in cases where the bidirectional signal communication is performed in a single optical transmission line using the optical branch-combine device as shown in FIG. 12 and where the multiplexing signal communication is conducted in using more than three or three transmission lines, the above advantages can be obtained if the polarization insensitive optical amplifying apparatus of this invention is used in each optical transmission line.

Figure 12:
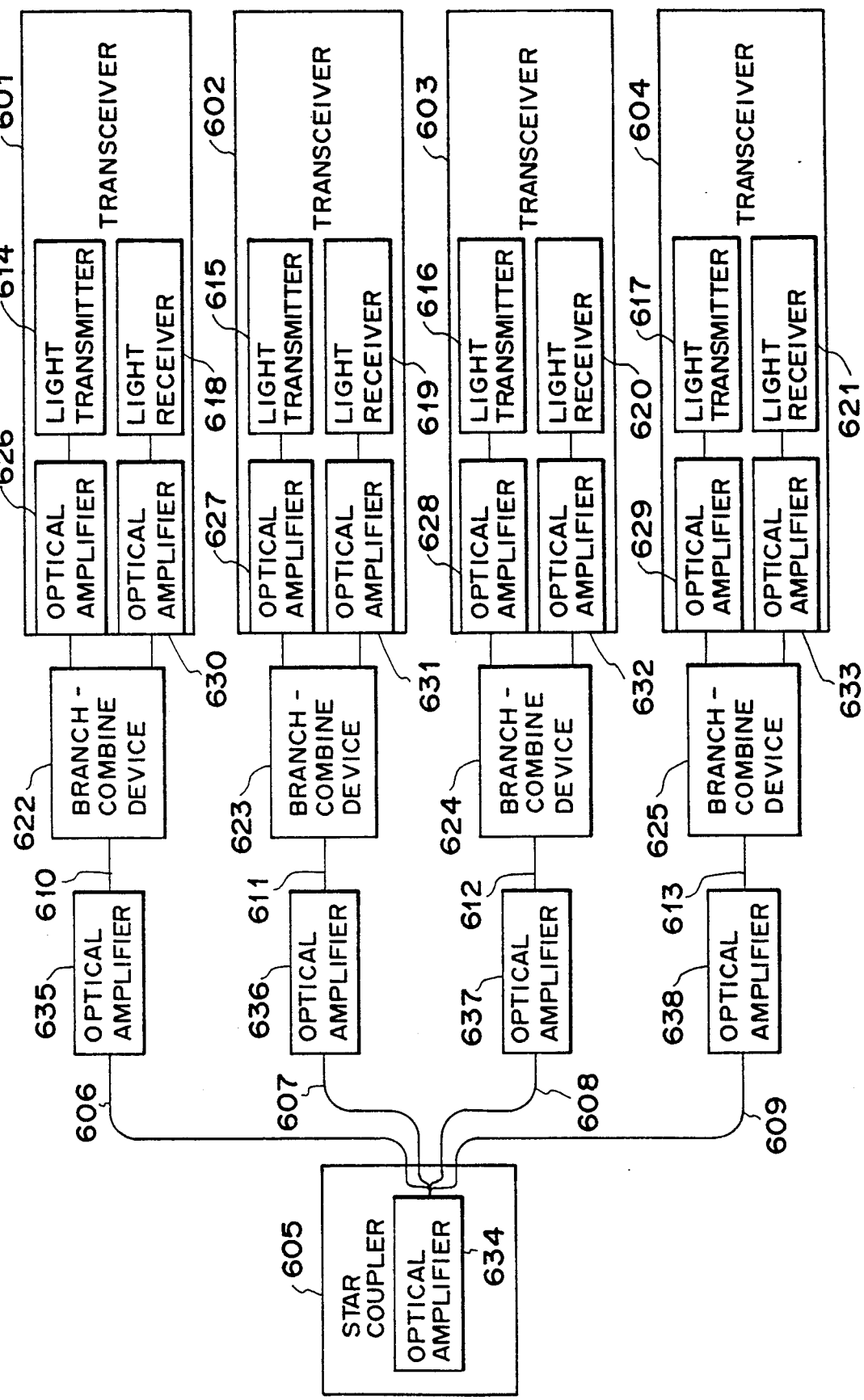
FIG. 12 is a block diagram showing a star type optical communication network using the optical amplifying apparatus according to the present invention.

FIG. 12 shows the structure of a star-type optical communication network in which the polarization insensitive amplifying apparatus is used. In this embodiment, there are four transceivers, and the optical signals are transmitted in each optical fiber in opposite directions.

In FIG. 12, the reference numerals 601-604 are transceivers which connect the terminals to the network, reference numeral 605 is a star coupler which connects inputs and outputs of the transceivers 601-604 in the network in a matrix form, reference numerals 606-613 are transmission lines which are optical fibers, reference numerals 614-617 are light transmitters which convert electric signals to optical signals to transmit them to the network, reference numerals 618-621 are light receivers which convert optical signals incident from the network to electric signals, reference numerals 622-625 are optical branch-combine devices which connect the transmitters 614-617 and receivers 618-621 in the transceivers to the optical fibers 610-613, and reference numerals 626-638 are the above optical amplifying apparatuses of this invention which directly amplify the optical signals. These amplifying apparatuses 626-638 are classified into booster amplifiers 626-629 of the light transmitters 614-617, pre-amplifiers 630-633 of the light receivers 618-621, a booster amplifier 634 of the star coupler 605 and repeater amplifiers 635-638 of the transmission line.

Next, the operation of this embodiment will be explained, assuming that the communication is performed from the end office 601 to the transceiver 603. The electric signal is converted into the optical signal in the transmitter 614 of the transceiver 601, and this light signal is amplified by the optical amplifier 626 and transmitted to the optical fiber 610 of the network through the branch-combine device 622. The optical signal incident on the optical fiber 610 is amplified by the optical amplifier 635 and is transmitted to the star coupler 605 through the optical fiber 606. The optical signal is amplified by the optical amplifier 634 in the star coupler 605, and is sent out to all the optical fibers 606-609 which are connected to the star coupler 605. The optical signals incident on the optical fibers 606-609 are amplified by the optical amplifiers 635-638, are branched by the branch-combine devices 622-625, and parts thereof are amplified by the optical amplifiers 630-633 to be transmitted to the receivers 618-621.

The receivers 618-621 convert the optical signals to electric signals. The transceivers 601-604 respectively discriminate the signal addressed to the own transceiver from those electric signals. This signal is addressed to the transceiver 603, so that the transceiver 603 identifies this signal and receives it. Thus, the communication is completed. Also in the star-type system, in order to transmit optical signals from any transceiver to all the transmission lines, the communication is conducted in such a manner that the optical signals will not collide with one another on the transmission line using the time division multiplexing, frequency division multiplexing, etc.

In this embodiment, the optical amplifying apparatuses of this invention are disposed in all paths along which the lights are transmitted in the network, but it is possible to dispose the optical amplifying apparatus in part of those paths. Further, in this embodiment, the transmitter and receiver are connected by the branch-combine device and the bidirectional communication is performed using one optical fiber for one transceiver. But, such system is possible in which two optical fibers for transmit and receive are used for one transceiver.

Also in this embodiment, there are above-mentioned technical advantages similar to the networks of FIGS. 8 and 10, since the optical amplifying apparatus of this invention are used.

Figure 13:
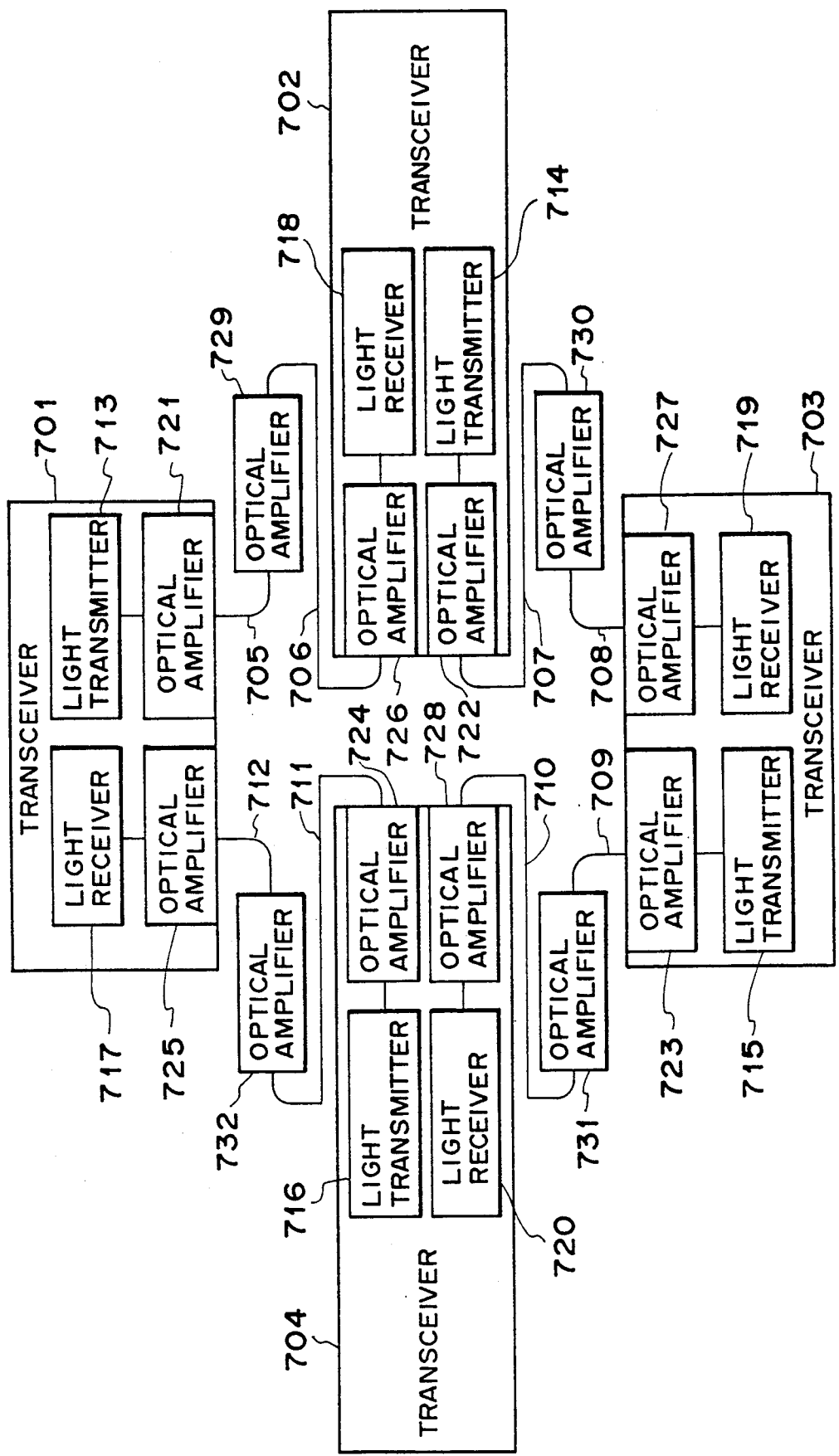
FIG. 13 is a block diagram showing a loop type optical communication network using the optical amplifying apparatus according to the present invention.

FIG. 13 shows the structure of a loop-type optical communication network in which the polarization insensitive type optical amplifying apparatus of this invention is used. In this embodiment, there are four transceivers and the optical signal is transmitted in a clockwise direction in the loop network. In FIG. 13, the reference numerals 701-704 are transceivers for connecting terminals to the network, reference numerals 705-712 are optical fibers, reference numerals 713-716 are transmitters for converting the electric signal to the optical signal to transmit it to the network, reference numerals 717-720 are receivers for converting the optical signal input from the network to the electric signal, and reference numerals 721-732 are optical amplifiers of this invention for directly amplifying the optical signal. The optical amplifiers 721-732 are classified to booster amplifiers 721-724 of the transmitters 713-716, pre-amplifiers 725-728 of the receivers 717-720 and repeater amplifiers 729-732 in the optical transmission line.

Next, the operation of this embodiment will be explained, assuming that the communication is conducted from the transceiver 701 to the transceiver 703. The electric signal is converted to the optical signal in the transmitter 713 of the transceiver 701, and is amplified by the optical amplifier 721 to be transmitted to the optical fiber 705 in the network. This optical signal is amplified by the optical amplifier 729, transmitted through the optical fiber 706, amplified by the optical amplifier 726 in the transceiver 702 and converted to the electric signal in the receiver 718. Since this signal is addressed to the transceiver 703, the signal is converted to the optical signal in the transmitter 714 of the transceiver 702 and this light signal is amplified by the optical amplifier 722 to be input into the optical fiber 707 in the network. This optical signal is amplified by the optical amplifier 730, transmitted through the optical fiber 708, amplified by the optical amplifier 727 of the end office 703, and converted to the electric signal in the receiver 719. Since this signal is addressed to the transceiver 703, the transceiver 703 identifies this signal and receives it. Thus, communication is completed.

In this embodiment, there are disposed the optical amplifiers in all the paths in the network along which lights are transmitted, but it is possible to dispose the optical amplifier in part of the paths in the network. Further, this embodiment is an active type in which the signal in the transceiver is re-generated and repeated. But, it is possible to construct a passive-type system in which the optical branch-combine device is used to connect the transceiver to the optical fiber which is the transmission line.

Also in this embodiment, since the optical amplifying apparatus of this invention is used, the above advantages can be obtained similarly to the networks of FIGS. 8 and 10.

Figure 14:
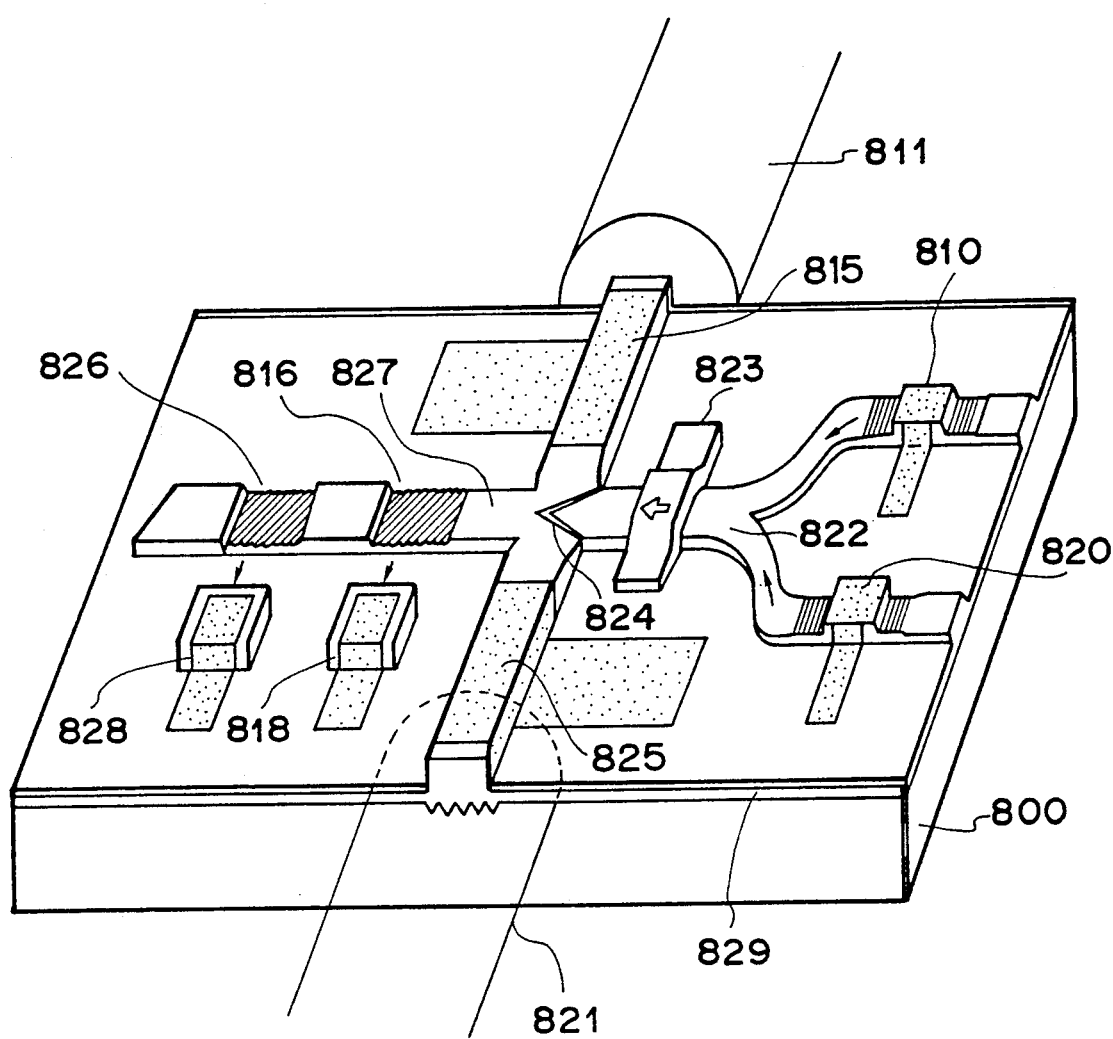
FIG. 14 is a schematic perspective view showing an arrangement of an integrated optical node incorporating the optical amplifying apparatus according to the present invention.

FIG. 14 shows the structure of an integrated optical node which includes the optical amplifying apparatus of this invention. This integrated optical node has functions of the devices or apparatuses 341, 332 and 312 in FIG. 8, and these functional parts are integrated on a common substrate.

In this optical node, GaAs/AlGaAs epitaxial layers are formed on a semiconductor substrate 800, such as GaAs, ridge-type waveguides are fabricated, and antireflection coatings 829 are formed on light input and output surfaces. The transmit part involves distributed Bragg reflection type lasers (DBR-LD) 810 and 820 which can respectively generate two lights of different wavelengths, and frequency multiplexed light signals are transmitted by a Y-combiner 822. The light wave after the Y-combiner 822 passes an isolator 823 and enters a branching coupler 824. The isolator 823 is structured, for example, by forming the epitaxial layer of dilute magnetic semiconductor, such as CdMnTe, on the GaAs epitaxial layer using the MBE process to fabricate a reciprocal part, non-reciprocal part and a polarization filter. Where the V-shaped coupler 824 is used, the reflection at this coupler is great, and therefore, the isolator 823 is indispensable. The optical amplifying apparatuses at both opposite sides of the branching coupler 824 respectively consist of optical amplifier parts 815 and 825. These amplifying apparatuses amplify the light from the light transmit part to transmit it to optical fibers 811 and 821 and at the same time amplify the signal light from the fibers 811 and 821 to input it into the light receive part. In this embodiment, the optical amplifier parts 815 and 825 are those which are described above referring to FIGS. 1-5D.

Next, the light receive part will be explained. The light signal is guided into branched waveguide 827 by the coupler 824. Bragg-diffracted by gratings 816 and 826, and light signals of desired wavelengths only are output to a slab waveguide portion located beside the ridge wave guide 827. Selected optical signals are detected by photodetectors 818 and 828 according to the wavelength. The photodetectors 818 and 828 have semiconductor laser structures, and can be operated as a photodetector by applying a reverse bias thereof.

At the side of the light receive part, there are no isolators, so it is necessary to make slant boundaries, tapered boundaries and so forth in order to oppress unnecessary reflections at each stepped portion. If isolators are disposed at both sides of the branching coupler, an improvement of performance can be expected.

Since the optical amplifiers of branching coupler of this embodiment have a wide wavelength range, this integrated optical node is preferably used in the frequency multiplexed system, such as the bus-type communication system shown in FIG. 8. In this embodiment, the amplifying apparatus of this invention is contained which is suitable to the fabrication of a module and is superior in the amplification characteristic. Thus, this integrated optical node advantageously utilizes the amplifying apparatus of this invention.

While there have been shown and described what are considered preferred embodiments of the present inventions, it will be obvious to those skilled in the art that various changes and modifications may be made therein without departing from the inventions as defined by the claims.

What is claimed is:

1. A semiconductor optical amplifying apparatus, comprising:
    a substrate;
    an active layer having a quantum well structure formed on said substrate, said active layer guiding first guided mode light and second guided mode light having a polarization direction perpendicular to that of the first guided mode light and amplifying the guided lights, said active layer having a wave-shape the height of which is less than respective extents of electric field distributions of the guided lights and which includes a plurality of inclined surfaces, a projected quantization axis obtained by projecting the quantization axis of the quantum well of said active layer in each inclined surface onto a plane perpendicular to a direction to which the guided lights are guided, forming an angle of 45° with respect to each vibration direction of electric field vectors of said first and second guided mode lights; and
    an electrode for supplying a current to said active layer.

2. An apparatus according to claim 1, wherein said active layer comprises a plurality of cyclically arranged portions.

3. An apparatus according to claim 2, wherein said active layer comprises a first plurality of portions having parallel projected quantization axes, and a second plurality of portions having projected quantization axes which are inclined at 45° with respect to vibration directions of electric field vectors in the first guided mode light and the second guided mode light and which are perpendicular to those of said first plurality of portions.

4. An apparatus according to claim 1, wherein the first guided mode light comprises TE mode light, and the second guided mode light comprises TM mode light.

5. An apparatus according to claim 1, further comprising a first cladding layer formed between said substrate and said active layer, and a second cladding layer formed on said active layer, said first cladding layer having a three-dimensional pattern constituted by a plurality of surfaces, and said active layer being formed on at least some of said plurality of surfaces.

6. An apparatus according to claim 1, wherein said active layer comprises a plurality of quantum well layers and a plurality of barrier layers, which are alternately stacked on each other.

7. A semiconductor optical amplifying apparatus, comprising:
a substrate;
an active layer having a quantum well structure formed on said substrate, said active layer guiding first guided mode light and second guided mode light having a polarization direction perpendicular to that of said first guided mode light and amplifying the guided lights, said active layer having a wave-shape the height of which is less than respective extents of electric field distributions of the guided lights, said wave-shape comprising a plurality of portions in which projected quantization axes adjacent each other, obtained by projecting quantization axes onto a plane perpendicular to a direction to which the guided lights are guided, are not parallel to each other, said plurality of portions being arranged such that a sum of gains to be imparted to the first guided mode light is equal to a sum of gains to be imparted to the second guided mode light; and
an electrode for supplying a current to said active layer.

8. An apparatus according to claim 7, wherein said active layer comprises a first plurality of portions having projected quantization axes which are inclined at 45° with respect to vibration directions of electric field vectors of the first guided mode light and the second guided mode light and which are parallel to each other, and a second plurality of portions having projected quantization axes which are inclined at 45° with respect to the vibration directions of the electric field vectors of the first guided mode light and the second guided mode light and which are perpendicular to those of said first plurality of portions.

9. An apparatus according to claim 7, wherein said active layer comprises a first plurality of portions having a projected quantization axis parallel to a vibration direction of an electric field vector of the first waveguide mode and a second plurality of portions having a projected quantization axis parallel to a vibration direction of an electric field vector of the second waveguide mode.

10. An apparatus according to claim 7, wherein the first guided mode light comprises TE mode light, and the second guided mode light comprises TM mode light.

11. An apparatus according to claim 7, further comprising a first cladding layer formed between said substrate and said active layer, and a second cladding layer formed on said active layer, said first cladding layer having a three-dimensional pattern constituted by a plurality of surfaces, and said active layer being formed on at least some of said plurality of surfaces.

12. An apparatus according to claim 7, wherein said active layer comprises a plurality of quantum well layers and a plurality of barrier layers, which are alternately stacked on each other.

13. A semiconductor optical amplifying apparatus comprising:
a substrate;
an active layer having a quantum well structure formed on said substrate, said active layer guiding first guided mode light and second guided mode light having a polarization direction perpendicular to that of the first guided mode light and amplifying the guided lights, said active layer having a wave-shape the height of which is less than respective extents of electric field distributions of the guided lights and which includes a plurality of inclined surfaces each of which forms an angle of 45° with respect to each vibration direction of the electric field vectors of the first and second guided mode lights; and
an electrode for supplying a current to said active layer.

14. An apparatus according to claim 13, wherein said active layer comprises a plurality of cyclically arranged portions.

15. An apparatus according to claim 14, wherein said active layer comprises a first plurality of portions having quantum well layers whose surfaces are parallel to each other, and a second plurality of portions having quantum well layers whose surfaces are inclined at 45° with respect to vibration directions of electric field vectors of the first guided mode light and the second guided mode light, and said second plurality of portions having quantum well layers whose surfaces are perpendicular to those of said first plurality of portions.

16. An apparatus according to claim 13, wherein the first guided mode light comprises TE mode light, and the second guided mode light comprises TM mode light.

17. An apparatus according to claim 13, further comprising a first cladding layer formed between said substrate and said active layer, and a second cladding layer formed on said active layer, said first cladding layer having a three-dimensional pattern constituted by a plurality of surfaces, and said active layer being formed on at least some of said plurality of surfaces.

18. A semiconductor optical amplifying apparatus comprising:
a substrate;
an active layer having a quantum well structure formed on said substrate, said active layer guiding first guided mode light and second guided mode light having a polarization direction perpendicular to that of the first guided mode light and amplifying the guided lights, said active layer having a wave-shape the height of which is less than respective extents of electric field distributions of the guided lights, said wave-shape comprising a plurality of portions in which adjacent quantum well layers are not parallel to each other, said plurality of portions being arranged such that a sum of gains to be imparted to the first guided mode light is equal to a sum of gains to be imparted to the second guided mode light; and
an electrode for supplying a current to said active layer.

19. An apparatus according to claim 18, wherein said active layer comprises a first plurality of portions having quantum well layers whose surfaces are inclined at 45° with respect to vibration directions of electric field vectors of the first guided mode light and the second guided mode light and are parallel to each other, and a second plurality of portions having quantum well layers whose surfaces are inclined at 45° with respect to the vibration directions of the electric field vectors of the first guided mode and the second guided mode and are perpendicular to those of said first plurality of portions.

20. An apparatus according to claim 18, wherein said active layer comprises a first plurality of portions having quantum well layers whose surfaces are parallel to a vibration direction of an electric field vector of the first guided mode light and a second plurality of portions having quantum well layers whose surfaces are parallel to the vibration direction of the electric field vector of the second guided mode light.

21. An apparatus according to claim 18, wherein the first guided mode light comprises TE mode light, and the second guided mode light comprises TM mode light.

22. An apparatus according to claim 18, further comprising a first cladding layer formed between said substrate and said active layer, and a second cladding layer formed on said active layer, said first cladding layer having a three-dimensional pattern constituted by a plurality of surfaces, and said active layer being formed on at least some of said plurality of surfaces.

23. A semiconductor optical amplifying apparatus for guiding light and amplifying the guided light, comprising:
- a substrate consisting of a semiconductor of a first conductivity type and having a flat surface;
- a first cladding layer formed on said flat surface of said substrate and consisting of a semiconductor of the first conductivity type, said first cladding layer having a wave-shape in a direction perpendicular to a direction to which the guided lights are guided on the upper side thereof, the height of the wave-shape being less than respective extents of electric field distributions of the guided lights, the wave-shape comprising a plurality of surfaces which are periodically provided, the adjacent surfaces being not parallel to each other;
- a semiconductor active layer having a quantum well structure formed on said wave-shape of said first cladding layer;
- a second cladding layer formed on said active layer and consisting of a semiconductor of a second conductivity type;
- a first electrode formed on said second cladding layer; and
- a second electrode contacting said substrate.

24. An apparatus according to claim 23, wherein said projections of said first cladding layer comprise a first plurality of surfaces inclined at 45° with respect to a surface of said substrate, and a second plurality of surfaces perpendicular to the surface of said substrate, and said active layer is formed on only said first plurality of surfaces.

25. An apparatus according to claim 23, wherein said projections of said first cladding layer comprise a first plurality of surfaces inclined at 45° with respect to a surface of said substrate and parallel to each other, and a second plurality of surfaces perpendicular to said first plurality of surfaces and parallel to each other.

26. An apparatus according to claim 23, wherein said projections of said first cladding layer comprise a first plurality of surfaces having a rectangular section and perpendicular to a surface of said substrate, and a second plurality of surfaces parallel to the surface of said substrate.

27. An apparatus according to claim 23, wherein said projections of said first cladding layer comprise a first plurality of surfaces having a trapezoidal section and perpendicular to a surface of said substrate, and a second plurality of surfaces inclined with respect to the surface of said substrate.

28. An apparatus according to claim 23, wherein said substrate essentially consists of n-GaAs, said first cladding layer essentially consists of n-AlGaAs, and said second cladding layer essentially consists of p-AlGaAs.

29. An apparatus according to claim 28, wherein said active layer comprises a plurality of non-doped GaAs quantum well layers and a plurality of AlGaAs barrier layers, which are alternately stacked on each other.

30. An apparatus according to claim 23, further comprising a buffer layer essentially consisting of a semiconductor of a first conductivity type and formed between said substrate and said first cladding layer, and a capping layer essentially consisting of a semiconductor of a second conductivity type and formed between said second cladding layer and said first electrode.

* * * * *

UNITED STATES PATENT AND TRADEMARK OFFICE
CERTIFICATE OF CORRECTION

PATENT NO. : 5,309,275
DATED : May 3, 1994
INVENTOR(S) : MICHIYO NISHIMURA, ET AL.

It is certified that error appears in the above-identified patent and that said Letters Patent is hereby corrected as shown below:

ON TITLE PAGE

In [30] Foreign Application Priority Data, insert:
--May 27, 1991 [JP] Japan ............ 3-151023--.

In [56] References Cited, under FOREIGN PATENT DOCUMENTS:
"1102983 4/1989 Japan" should read
--1-102983 4/1989 Japan--.

COLUMN 4

Line 62, "on" should read --of--.

COLUMN 10

Line 5, "B" should read --B to--.

Signed and Sealed this

Eleventh Day of October, 1994

Attest:

BRUCE LEHMAN

*Attesting Officer*    *Commissioner of Patents and Trademarks*